(12) United States Patent
Ezaki

(10) Patent No.: US 6,660,546 B2
(45) Date of Patent: Dec. 9, 2003

(54) METHOD OF ETCHING AN OBJECT, METHOD OF REPAIRING PATTERN, NITRIDE PATTERN AND SEMICONDUCTOR DEVICE

(75) Inventor: Mizunori Ezaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/342,361

(22) Filed: Jan. 15, 2003

(65) Prior Publication Data

US 2003/0146485 A1 Aug. 7, 2003

Related U.S. Application Data

(62) Division of application No. 09/819,891, filed on Mar. 29, 2001, now Pat. No. 6,531,403.

(30) Foreign Application Priority Data

Mar. 30, 2000 (JP) .......................................... 2000-95143
Sep. 29, 2000 (JP) ........................................ 2000-300633

(51) Int. Cl.[7] .............................................. H01L 21/66
(52) U.S. Cl. ..................... 438/25.03; 438/710; 257/410
(58) Field of Search .............................. 438/25.03, 725, 438/710; 378/34, 35; 437/241; 257/410

(56) References Cited

U.S. PATENT DOCUMENTS

| 4,154,251 A | 5/1979 | Doyel |
| 4,708,766 A | 11/1987 | Hynecek |
| 4,863,556 A | 9/1989 | Reichert |
| 4,956,314 A | 9/1990 | Tam et al. |
| 5,124,561 A | 6/1992 | Faure et al. |
| 5,354,698 A | 10/1994 | Cathey, Jr. |
| 5,465,220 A | 11/1995 | Haruki et al. |
| 5,781,607 A | 7/1998 | Acosta et al. |
| 5,811,358 A | 9/1998 | Tseng et al. |
| 6,197,697 B1 | 3/2001 | Simpson et al. |
| 6,208,002 B1 * | 3/2001 | Satake et al. ................. 257/410 |
| 6,225,193 B1 | 5/2001 | Simpson et al. |
| 6,228,691 B1 * | 5/2001 | Doyle .......................... 438/149 |
| 6,351,403 B2 * | 2/2002 | Abdoulin ..................... 363/127 |
| 6,381,300 B1 | 4/2002 | Ezaki |

OTHER PUBLICATIONS

G.S. Oehrlein, et al., Journal of Electromechanical Society: Solid State Science and Technology, vol. 132, No. 6, pp. 1441–1447, "Near–Surface Damage and Contamination After CF4/H2 Reactive Ion Etching of Si", Jun. 1985.

* cited by examiner

Primary Examiner—John F. Niebling
Assistant Examiner—Olivia Luk
(74) Attorney, Agent, or Firm—Oblon, Spivak, McClelland, Maier & Neustadt, P.C.

(57) ABSTRACT

A method of manufacturing a compound layer, containing a nitrified metal as a mayor component thereof and having a predetermined microstructure pattern, includes: an ion implantation step for implanting hydrogen ions into a predetermined region of a compound layer formed on a substrate to form an implanted region; and an etching step for selectively etching the implanted region by using a gas containing at least oxygen, to remove the implanted region of the compound layer while maintaining the other region as a microstructure pattern. By introducing a halogen element like fluorine in addition to hydrogen, fabrication of the pattern can be executed more reliably and more easily. As a result, volatility of reaction products produced upon etching the compound layer is enhanced, and micro-loading effects are suppressed. Thus, there are provided a method of fabricating a pattern of a compound layer capable of improving the CD controllability without using a dummy pattern, for example, and a compound layer having a microstructure pattern.

8 Claims, 22 Drawing Sheets

PROCESS A    PROCESS B
FIG. 11A  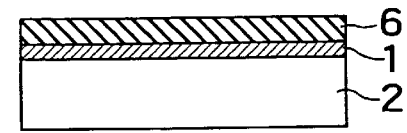
FIG. 11B 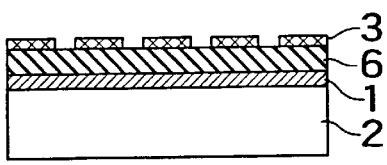 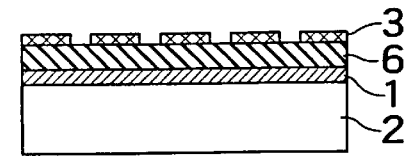
FIG. 11C 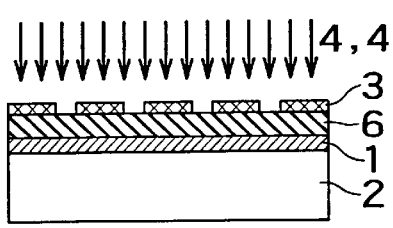 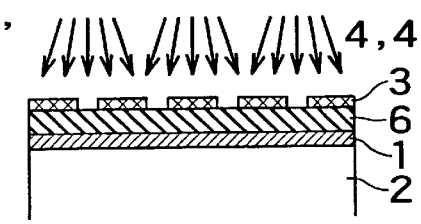
FIG. 11D 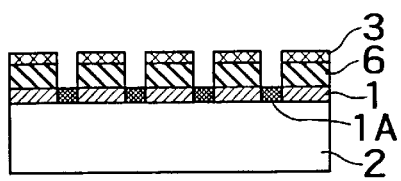 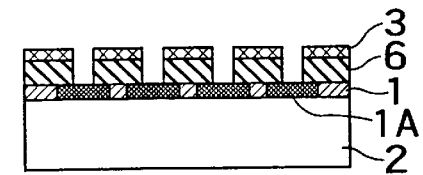
FIG. 11E 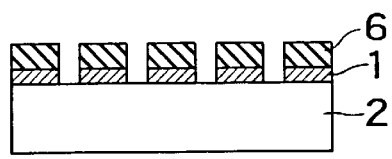 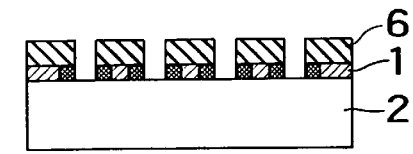
FIG. 11F 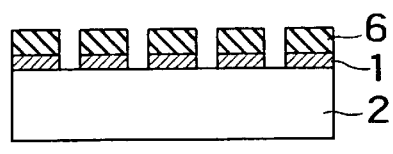 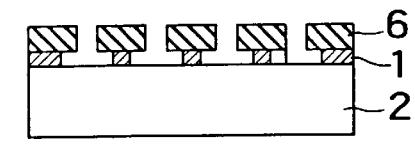

CrN
CHF3
750/300W
IRRADIATED
FOR 3 min

CrN
WITHOUT
IRRADIATION

TiN
CHF3
600/300W,
IRRADIATED
FOR 3 min

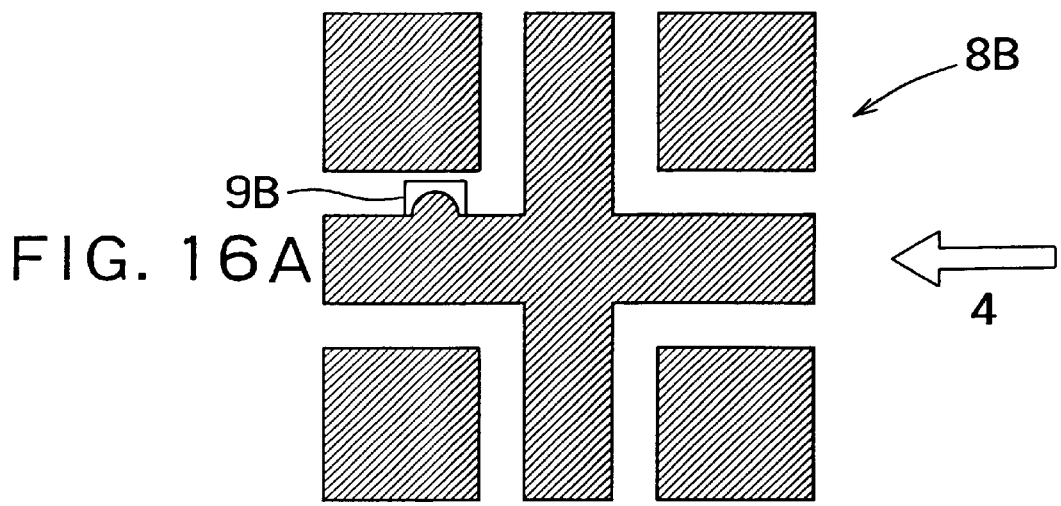
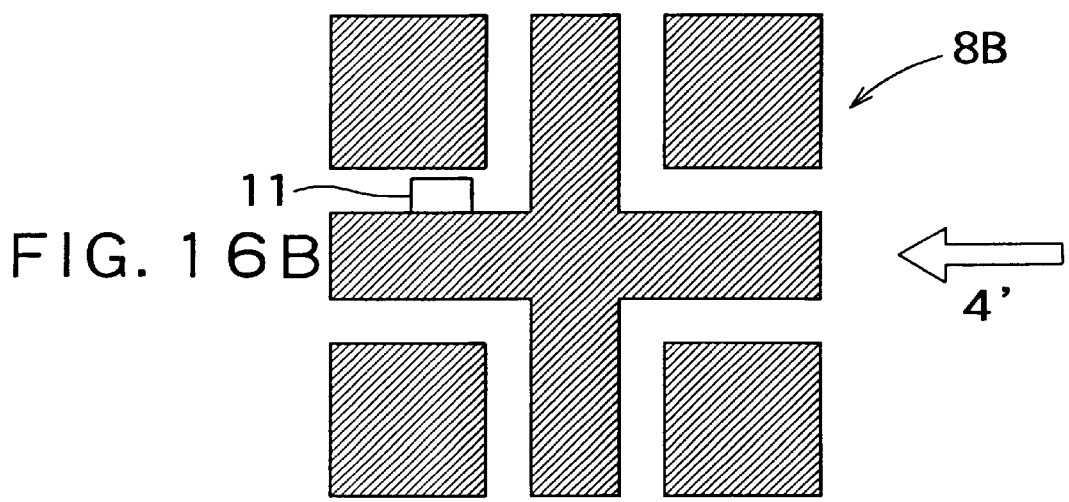
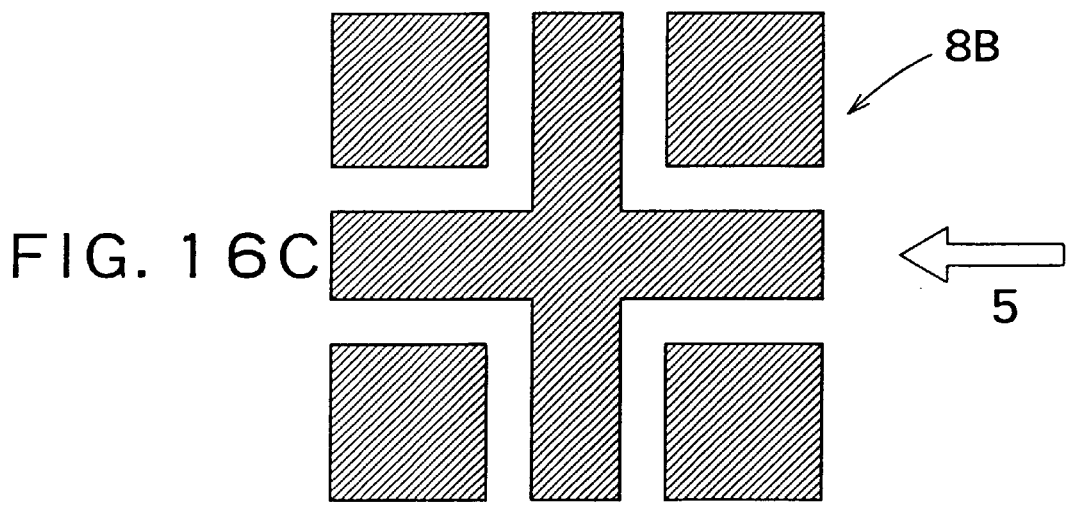

METHOD OF ETCHING AN OBJECT, METHOD OF REPAIRING PATTERN, NITRIDE PATTERN AND SEMICONDUCTOR DEVICE

BACKGROUND OF THE INVENTION

This invention relates to a method of etching an object, a method of repairing a pattern, a nitride pattern and a semiconductor device, and more particularly to methods for making and repairing a microstructure pattern of a nitride film such as chromium nitride ($CrN_x$) or gallium nitride (GaN) usable for manufacturing semiconductor devices or optical devices, and a nitride pattern obtained by any of those methods as well as a semiconductor device having such a nitride pattern.

The invention is applicable to various fields such as masks suitable for use in exposure processes using various beams like optical or electrically charged beams or X-rays, or liquid crystal displays using those masks.

A lot of nitrides including metallic nitrides or nitride semiconductors are materials that contribute to enhancing higher performances and higher functions of various devices such as electronic devices and optical devices, for example, importance of process techniques for making microstructure patterns of various nitrides is progressively increasing. For example, metal material films containing chromium (Cr) as their major components are currently used most in opaque or attenuating phase-shift materials of photomasks (or reticles) for exposure or transference in photolithography. Additionally, since the use of chromium nitride ($CrN_x$) films facilitates to control the film stress, they have been proved to be useful also as hard mask materials for making absorber patterns for X-ray exposure masks (Japanese Patent Laid-Open Publication No. 11-65095). Then, along with micro-miniaturization of LSI elements and other circuit elements, there is a strong demand for developments of techniques for making microstructure patterns of exposure mask material films, especially those containing chromium as their major component.

In the field of lithography, for the purpose of transference or resolution of patterns smaller than exposure wavelengths, the use of optical proximity repair (OPC) masks and phase shift masks is indispensable for accurately controlling complicated geometry of mask patterns and pattern sizes.

With reduced pattern size of films made of those materials containing chromium as their major component, dry etching using chlorine ($Cl_2$) is currently used in lieu of conventional wet etching. In the process of making microstructure patterns by dry etching, there is the problem that "micro-loading effect" occurs due to a difference in pattern density and degrades the uniformity of pattern sizes. The "micro-loading effect" pertains to a phenomenon occurring upon simultaneously etching a pattern of a higher density and a pattern of a lower density: due to a difference in etching rate of a film from a location to another, the amount of reaction products by etching becomes locally dense or sparce, and convection of a large amount of reaction products by etching with a low volatility causes an un-uniformity in etching rate. Therefore, in the process of manufacturing photomasks or semiconductor integrated circuits, efforts are made toward suppressing the micro-loading effect by placing a dummy pattern in a region having no circuit pattern to be made. on the other hand, not only microprocessing techniques, but also defect inspection/repair are needed for advanced photolithography. In case of fine, complex features, inspection and repair of defects especially in OPC masks and various types of phase shift masks are not limited to the inspection and repair pinholes or particles, for example, but include inspection and repair of defects of transparency of films, phase shift difference, or the like, in addition of defects of micro OPC patterns, foreign matters, image placement error of patterns and CD deviation of sizes, establishment of techniques for accurate inspection and repair for that purpose is longed for.

Currently employed defect repair techniques include those using a laser and those using a focused ion beam, and the latter is used more commonly. A repair technique using a focused ion beam is configured to remove "opaque defects" like bridges by irradiating them with a gallium ion ($Ga^+$) beam while blowing an etching gas, if necessary, and correct "clear defects" like pinholes by irradiating them with a gallium ion ($Ga^+$) beam while blowing a carbon-hydrogen gas to make a carbon compound coating.

Pattering of nitride semiconductor with fine features has become essential for the fabrication of more advanced devices of various types. For example, light emitting diodes using III-V nitride semiconductors such as GaN, AlN, InGaN, and so on, are being brought into practical use as light sources over a wavelength range from ultraviolet to green. Additionally, researches and developments are progressing toward their use as electronic devices using their properties as wide gap semiconductors. Then for higher performance of those devices, trials are being made for making fine patterns of various nitride semiconductors. Heretofore, however, plasma etching techniques using the etching gas, containing $Cl_2$ (chlorine) or $F_2$ (fluorine) gases have been used in etching processes, and these techniques involve the problems that high-density plasma damages surfaces of devices and changes in composition ratio of Ga/N, etc. on surfaces.

Reaction products by etching of chromium (Cr)-group materials are usually low in volatility and are liable to cause the micro-loading effect in dry etching. Therefore, it is an important issue how CD (critical dimension) controllability is enhanced in photomasks or reticles or in other circuit substrates.

Especially regarding a photomasks having an OPC pattern, since the pattern size of an OPC pattern is smaller than that of other patterns, and highly anisotropic etching is required there. Although the bias voltage to the substrate and the vapor pressure of the etchant gas, the reaction products are driven to adhere the side-walls of patterns by high pressure of the etchant gas and this adhesion of reaction products prevents from the etchant adhering to the etching material. As a result, the micro-loading effects is liable to occur, and it is extremely difficult for the mask to be CD controlled in the reticle plane. If the CD controllability is poor, the resultant pattern size of the reticle will be un-uniform between its central portion and its peripheral portion.

Conventionally proposed techniques with a dummy pattern require simulation calculation for optimizing the pattern configuration and densities using dummy patterns, and it is difficult to simplify a manufacturing process or make it inexpensive by using such techniques for the mask with OPC patterns.

Dry etching using a chlorine-group gas involves another problem caused by toxicity of the chlorine gas to human bodies and its high corrosiveness, for which there is the need for nitrogen purge of the chambers and pipes after etching and the need for extreme attention in handling it.

Furthermore, in case of repairing defects of photomasks, reticles or various kinds of circuit substrates using chromium-based films, opaque defect repair by a focused ion beam or a laser beam may excessively remove irradiated portions of substrates other than the defects, or may result in deterioration of transmittance by the implanted gallium ions, and damages to transparent substrates were a serious problem.

Similarly to etching of chromium-based materials, also in fabrication of patterns of various kinds of metallic nitrides and nitride semiconductors or other materials containing nitrogen, the micro-loading effect and defects of patterns occur in the etching process, and suppression and repair of them are serious issues when fabricating devices.

SUMMARY OF THE INVENTION

Under acknowledgement of those problems, it is an object of the invention to provide a method of etching an object, a method of repairing a pattern, a nitride pattern and a semiconductor device that suppress or minimize the micro-loading effect as a result of etching of a nitride material with increasing the volatility of reaction products and can ensure CD controllability without using a dummy pattern, or other like means.

According to the invention, there is provided a method of etching an object comprising: preparing the object containing nitrogen; implanting hydrogen into a predetermined region of the object; and selectively removing the predetermined region from the object, by exposing the object to an atmosphere containing excited oxygen.

According to the invention, there is also provided a method of repairing a pattern comprising: making a portion of the pattern to be removed contain nitrogen and hydrogen; and etching the portion to be removed by exposing to an atmosphere containing excited oxygen.

According to the invention, there is also provided a nitride pattern, comprising a nitride layer having a selectively removed portion, the portion being implanted with hydrogen and then exposed to an atmosphere containing excited oxygen so as to be selectively removed the portion from the nitride layer.

According to the invention, there is provided a semiconductor device comprising: a substrate; a semiconductor element formed on the substrate; a nitride layer formed over the semiconductor element, the nitride layer having a selectively removed region, the region being implanted by hydrogen and then exposed to an atmosphere containing excited oxygen so as to be selectively removed the region from the nitride layer.

According to the invention, there is also provided a semiconductor device comprising: a substrate; a plurality of transistor elements formed on the substrate; an interconnect layer formed over the transistor elements; a first nitride layer below the interconnect layer having a first air portions; a second nitride layer on the interconnect layer having a second air portions; and a protective layer over the second nitride layer.

According to the invention, there is also provided a method of manufacturing the semiconductor device having a substrate, a plurality of transistor elements formed on the substrate, an interconnect layer formed over the transistor elements, a first nitride layer below the interconnect layer having a first air portions, a second nitride layer on the interconnect layer having a second air portions, and a protective layer over the second nitride layer, the method comprising: forming the first nitride layer without the first air portions and the second nitride layer without the second air portions; implanting hydrogen into corresponding portions of the nitride layers, the corresponding portions being the first and the second air portions to be made; and irradiating plasma containing excited oxygen to the nitride layers to remove the corresponding portions thereby making the first and the second air portions in the nitride layers.

Especially when a nitride semiconductor is used as the compound layer, it can be used for patterning of an electronic device or light emitting element that emits light in a short wavelength range of ultraviolet or blue, for example. In the specification, "nitride semiconductors" mean any III-V compound semiconductors expressed by the general formula $B_x In_y Al_z Ga_{(1-x-y-z)} N (0 \leq x \leq 1, 0 \leq y \leq 1, 0 \leq z 1)$.

As summarized above, according to the invention, when the etching method by oxygen plasma using effects of $H^+$ ions for etching a thin film having as its major component a nitrogen-containing compound layer of a metal such as chromium or nitrogen-containing compound semiconductor, etching takes place by chemical etching that produces highly volatile reaction products. Therefore, unlike the conventional etching methods using chlorine-group gases, the invention can suppress the micro-loading effect and can fabricate precise OPC (optical proximity repair) masks, Levenson phase shift masks, or and so on.

Additionally, according to the invention, a gas containing hydrogen and an oxygen gas can be used for etching instead of chloride gases heretofore used by the conventional dry etching methods, so it is a microstructure pattern fabrication method that is simple and safe.

Further, according to the invention, when repairing defects of photomasks, reticles or various kinds of circuit substrates using chromium or its compound layers, accurate repair is possible without damaging portions other than defects of patterns.

Furthermore, according to the invention, by implanting a halogen element such as fluorine in addition to hydrogen, patterns can be made more reliably, more easily.

Moreover, according to the invention, it is possible to manufacture exposure masks and various kinds of microstructure patterns of nitrogen-containing compound layers simply and inexpensively. At the same time, by using the inexpensive exposure masks, the cost of lithography process can be reduced, and inexpensive semiconductor devices or optical elements can be supplied. Thus the invention has a lot of industrial advantages.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 11A through 11F are cross-sectional views that roughly show a central portion of a process of making a CrN microstructure pattern, used in the sixth example of the invention;

FIGS. 16A through 16C are diagrams that show the concept of a method of repairing defects in a CrN photomask according to the second embodiment of the invention;

DETAILED DESCRIPTION OF THE PREFERRED EMBODIMENTS

Figure 1A:
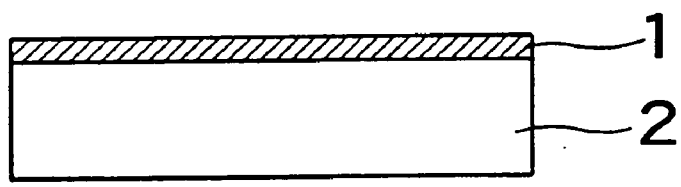
FIGS. 1A through 1D are cross-sectional views that show the basic concept of a process according to an embodiment of the invention.

Now referring to the drawings, embodiments of methods of making a pattern and patterns of compounds according to the invention are explained in detail.

First Embodiment

FIGS. 1A through 1D are cross-sectional views that show the basic concept of a process according to the first embodiment of the invention.

In this embodiment, a compound layer 1 containing nitrogen is first formed on a substrate 2 as shown in FIG. 1A.

Figure 1B:
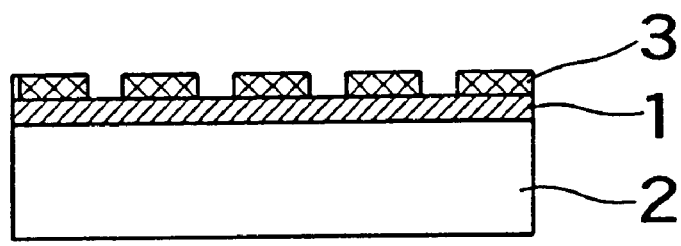

Next as shown in FIG. 1B, a resist mask 3 of a predetermined pattern is formed on the compound layer 1. Chromium nitride, for example, can be used as the material of the compound layer 1.

Figure 1C:
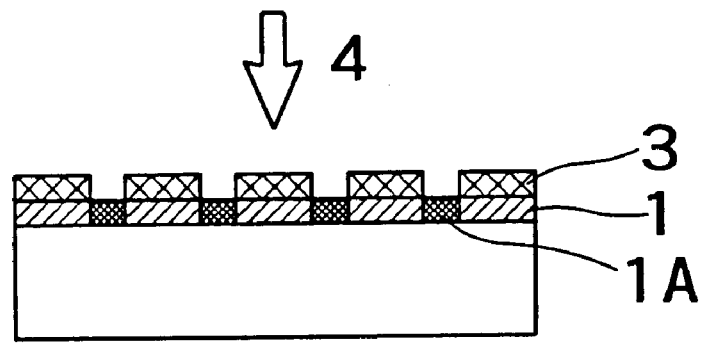

Next as shown in FIG. 1C, hydrogen ions 4 are implanted. Then, in this process, the intrusion of hydrogen ions 4 is blocked by the mask 3, and the hydrogen ions are selectively implanted only into portions of the compound layer 1 exposed through apertures of the mask 3 to form hydrogen-implantation regions 1A there.

Figure 1D:
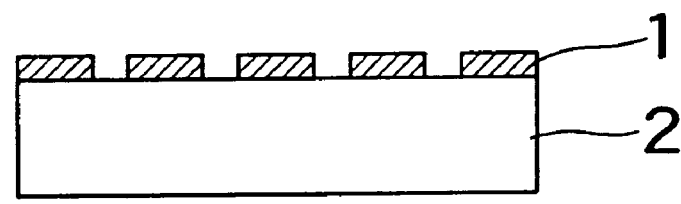

Then as shown in FIG. 1D, a gas 5 containing excited oxygen, such as oxygen plasma, is exposed. As a result, the resist mask 3 is removed, and those portions of the compound layer 11 implanted with hydrogen ions 4 are etched and removed. The reason why the compound layer 1 is etched probably lies in that highly volatile reaction products with an extremely high equilibrium vapor pressure are caused by reaction of the hydrogen-containing compound layer 1 with oxygen.

As explained above, this embodiment uses quite a unique phenomenon that a hydrogen-implanted compound layer is etched when exposed to an atmosphere of excited oxygen. Then, the invention gives the following effects.

First, according to the invention, the etching caused by excited oxygen in the compound layer implanted with $H^+$ (hydrogen) ions is chemical etching with very volatile reaction products. Therefore, as compared with the existing etching technique using a chloride gas, micro-loading effect can be suppressed, and CD controllability on the substrate can be enhanced. As a result, optical proximity repair masks, Levenson phase shift masks, and so on, having a high accuracy can be fabricated easily and reliably.

Additionally, the microstructure pattern fabricating method according to the embodiment enables simple and safe etching only with a hydrogen-containing gas and an oxygen gas instead of a chlorine compound gas heretofore used in dry etching of a material film containing chromium as its major component. Further, according to the invention, also when defects in photomasks, reticles and various kinds of circuit boards using chromium compound films should be repaired, they can be modified accurately without damaging the remainder portions.

It is also possible to fabricate chromium-based exposure masks and various kinds of microstructure patterns easily and inexpensively.

Moreover, through trial manufacture and researches, the Inventor recognizes that metallic nitrides usable in the embodiment are not limited o chromium nitrides, but the invention is similarly applicable to other nitrides of titanium (Ti), aluminum (Al), molybdenum (Mo), tungsten (W), gallium (Ga), indium (In) and boron (B).

The first embodiment will be explained below in greater detail with reference to the first to fifth examples of the invention.

First Example

A photomask fabricating method using a chromium nitride ($CrN_x$), taken as the first example of the invention, is first explained with reference to FIGS. 1A through 1D.

First referring to FIG. 1A, a chromium nitride film 1 was deposited on a substrate 2. More specifically, by introducing a cleaned 6.35 mm thick 6-inch quartz substrate 2 into a reactive sputtering apparatus, using Cr as the target material, the $CrN_x$ film 1 with 10 nm thickness as a opaque film, was deposited, using a mixed gas of a nitrogen/argon mixed gas under the pressure of 5 mTorr. After that, through ultrasonic cleaning, a mask blanks were obtained.

In case that a CrON film (not shown) as an anti-reflection film is to be formed on the $CrN_x$ film, the film is deposited in the same chamber, using a mixed gas of nitrous oxide ($N_2O$) and argon under to pressure of 5 mTorr such that the total thickness with the $CrN_x$ film 1 becomes 100 nm. Thereafter, through ultrasonic cleaning, a mask blanks are obtained.

Next as shown in FIG. 1B, a resist mask 3 is formed. More specifically, ZEP7000B (Nippon Zeon), commercially available electron beam resist, was coated on the surface of the mask blanks with a spin coater at the spin velocity of 1800 rpm for 50 seconds. Then through a baking process using a hot plate, a 500 nm thick photosensitive film was made, and a pattern was written by using an electron beam writing apparatus having the acceleration voltage of 75 kV. For the purpose of obtaining a desired writing accuracy, multiple exposure method for forming a pattern by four-pass writing was employed, and optical proximity effect repair was executed by repairing the amount of irradiation. After the writing, the resist mask 3 was developed.

After that, as shown in FIG. 1C, hydrogen was implanted. More specifically, hydrogen plasma 4 of a mixed gas of hydrogen and nitrogen (gas pressure: 0.5 Pa, flow rate: 100 sccm) was irradiated for three minutes in a plasma etching apparatus under the antenna output of 750 W and the bias output of 300 W. When the hydrogen plasma is irradiated on the substrate, most of $H^+$ ions with small mass intrude deeply into the $CrN_x$ and CrON films under the openings of the resist mask, whereas the resist could prevent the H+ ions from penetrating the $CrN_x$ and CrON films. This was confirmed by secondary ion mass spectrometry (SIMS).

Next as shown in FIG. 1D, the structure is exposed to a oxygen plasma. More specifically, the resist mask 3 was removed by oxygen plasma 5 with the antenna output of 500 W (gas pressure: 0.7 Pa, flow rate: 100 sccm), and the hydrogen plasma-irradiated $CrN_x$ film 1 was etched by the oxygen plasma. Thus the pattern was obtained.

Second Example

Next explained is the second embodiment of the invention.

FIGS. 2A through 2I are cross-sectional views that show a manufacturing process according to the same embodiment. That is, these figures illustrate a manufacturing process for fabricating a single trench type Levenson phase shift mask according to the same.

Figure 2A:
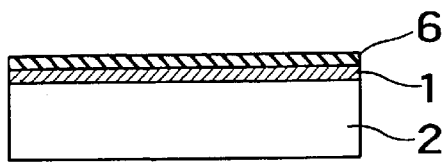
FIGS. 2A through 2I are cross-sectional views that show a manufacturing process, taken as the second example according to the same embodiment.

First as shown in FIG. 2A, a chromium nitride layer 1 and a silicon oxide film 6 were deposited on a substrate 2. More specifically, by introducing a cleaned 6.35 mm thick 6-inch quartz substrate 2 into a reactive sputtering apparatus, using Cr as the target material, the $CrN_x$ film 1, 100 nm thick and functioning as a opaque film, was deposited, using an argon gas under the pressure of 5 mTorr. After that, through ultrasonic cleaning, a mask blanks were obtained. In case that a CrON film (not shown) as an anti-reflection film is to be formed on the $CrN_x$ film, the film is deposited in the same chamber, using a mixed gas of nitrous oxide ($N_2O$) and argon under to pressure of 5 mTorr such that the total thickness with the $CrN_x$ film 1 becomes 100 nm. After that, a 100 nm thick $SiO_2$ film 6 was deposited on the mask blanks in the same reactive sputtering apparatus, changing the target and the gas.

Figure 2G:
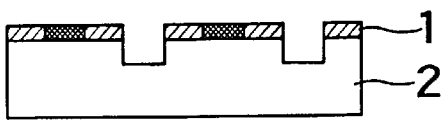
Figure 2B:
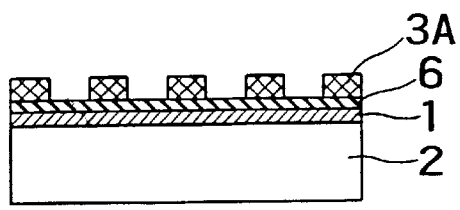

Next as shown in FIG. 2B, a first resist mask 3A was formed. More specifically, ZEP520 (Nippon Zeon), commercially available electron beam resist, was coated with a spin coater at the spin velocity of 1500 rpm for 50 seconds. Then through baking process using a hot plate, a 500 nm thick resist layer was formed, and a pattern was written by using an electron beam writing apparatus having the acceleration voltage of 75 kV. For the purpose of obtaining a desired accuracy, multiple exposure method for forming a pattern by four-pass exposure was employed, and optical proximity effect repair was executed by repairing the amount of irradiation. After the writing, the resist mask 3A was developed.

Figure 2H:
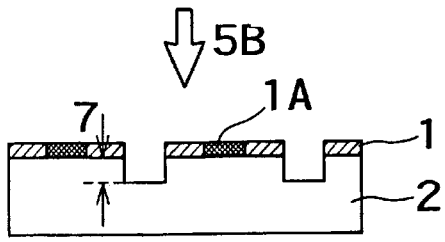
Figure 2C:
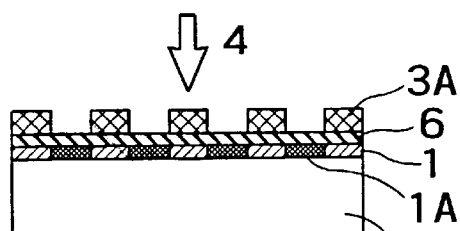

After that, as shown in FIG. 2C, hydrogen was implanted. More specifically, hydrogen plasma 4 of a mixed gas of hydrogen and nitrogen (gas pressure: 0.5 Pa, flow rate: 100 sccm) was irradiated for three minutes in a plasma etching apparatus under the antenna output of 750 W and the bias output of 300 W. Thereby, hydrogen-implanted regions 1A were formed to lie under openings of the resist mask 3A.

Figure 2I:
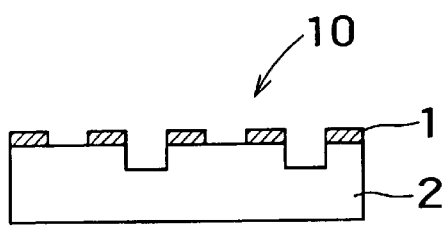
Figure 2D:
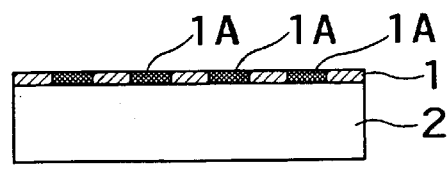

Next as shown in FIG. 2D, the resist mask 3A and the $SiO_2$ film 6 were removed. More specifically, they were removed by using a spin coater, coating o-dichlorobenzene and ammonium fluoride liquid, respectively and conducting wet etching.

Figure 2E:
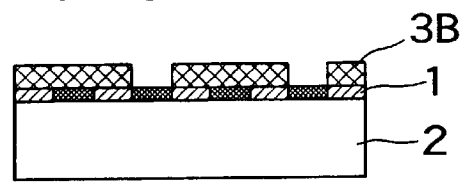

Next as shown in FIG. 2E, a second resist mask 3B was formed. More specifically, after cleaning the surface of the mask blanks, by again using the spin coater, a 500 nm thick photosensitive resist film 3 was formed by coating ZEP-7000B (Nippon Zeon), commercially available electron beam resist, and thereafter baking it with a hot plate. Then a pattern was written by using an electron beam writing apparatus having the acceleration voltage of 75 kV. For the purpose of obtaining a desired writing accuracy, multiple exposure method for forming a pattern by four-pass writing was employed, and optical proximity effect repair was executed by repairing the amount of irradiation. After the writing, the resist was developed, and resist mask 3B was formed.

The image placement accuracy of the pattern written in this process relative to that written in the step shown in FIG. 2B was 20 through 30 nm at 3σ-level.

Figure 2F:
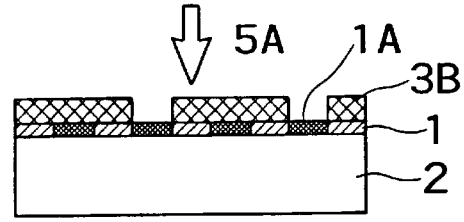

Thereafter, as shown in FIG. 2F, the structure was exposed to plasma 5A of a mixed gas of sulfer hexafluoride ($SF_6$) and oxygen.

As a result, as shown in FIG. 2G, the hydrogen-implanted regions 1A of the $CrN_x$ film under openings of the resist mask 3B were etched and removed, and the quartz substrate 2 was also etched. The quartz substrate 2 was etched only to a predetermined depth 7 (thickness with which the phase shift of the quartz by exposure light became π radian).

Next as shown in FIG. 2H, the structure was exposed to oxygen plasma 5B. That is, as a result of exposure to oxygen plasma 5B of the antenna output of 500 W (gas pressure: 0.7 Pa, flow rate: 100 sccm), the resist mask 3B was removed, the hydrogen-implanted region 1A of the $CrN_x$ film was etched, and as shown in FIG. 2I, a single-trench Levenson phase shift mask 10 was fabricated.

Third Example

Next explained is the third example, which is an example of making a super-fine structure with a pattern size of 10 nm or less.

FIGS. 3A through 3E are cross-sectional views that show a manufacturing process according to the same embodiment.

Figure 3A:
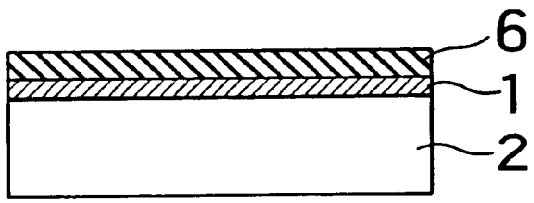
FIGS. 3A through 3E are cross-sectional views that show a process of manufacturing a microstructure pattern, taken as the third example according to the same embodiment.

First as show in FIG. 3A, a chromium nitride layer 1 and a silicon oxide film 6 were deposited on a substrate 2. More specifically, by introducing a cleaned 0.7 mm thick 8-inch Si substrate 2 into a reactive sputtering apparatus, using chromium as the target material, the $CrN_x$ film 1 with 100 nm thickness as a opaque film, was deposited, using a mixed gas of nitrogen and argon under the pressure of 5 mTorr. Additionally, a 500 nm thick $SiO_2$ film 6 was deposited by changing the target and the gas.

Figure 3B:
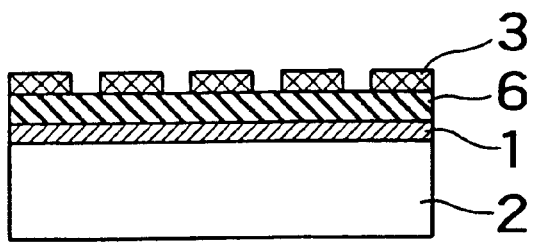

Next as shown in FIG. 3B, a resist mask 3 was formed. More specifically, ZEP520 (Nippon Zeon), commercially available electron beam resist, was coated with a spin coater at the spin velocity of 2000 rpm for 50 seconds. Then through baking process using a hot plate, a 350 nm thick photosensitive layer was made, and a pattern was written by using an electron beam writing apparatus having the acceleration voltage of 75 kV. For the purpose of obtaining a desired writing accuracy, multiple exposure method for forming a pattern by four-pass writing was employed, and optical proximity effect repair was executed by repairing the amount of irradiation. After the writing, through development, the resist mask 3 was made.

Figure 3C:
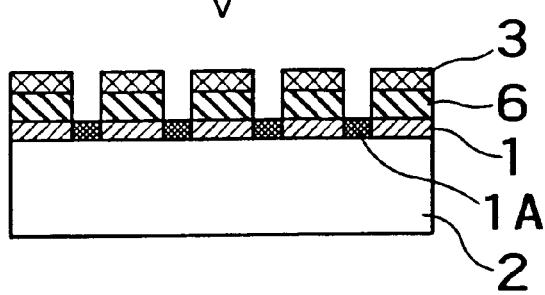

After that, as shown in FIG. 3C, etching and hydrogen-implantation were conducted. More specifically, the plasma 4 of a $CHF_3$ gas (gas pressure: 0.6 Pa, flow rate: 100 sccm) was irradiated for three minutes in a plasma etching apparatus under the antenna output of 750 W and the bias output of 300 W. As a result, selective portions of the silicon oxide film 6, which were not covered by the resist mask 3, were etched, and hydrogen-implanted regions 1A were formed at exposed portions of the $CrN_x$ film 1.

Figure 3D:
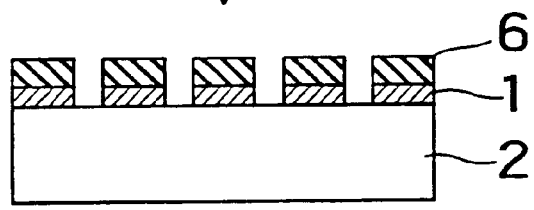
Figure 3E:
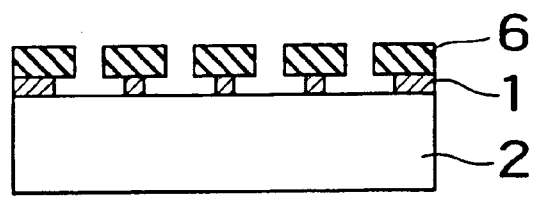

Next as shown in FIG. 3D, the fine structure was fabricated by oxygen plasma. More specifically, as a result of irradiation of oxygen plasma 5 with the antenna output of 500 W (gas pressure: 0.7 Pa, flow rate: 100 sccm) for 15 minutes, the resist mask 3 was removed, and the hydrogen-implanted regions 1A of the $CrN_x$ film were etched and removed.

Further, oxygen plasma 5 with the antenna output of 500 W (gas pressure: 0.7 Pa, flow rate: 100 sccm) was continuously irradiated. Thereby, the $CrN_x$ film 1 left under the $SiO_2$ film 6 was side-etched, and it was confirmed that microstructure patterns with a size of 10 nm or less could be made as well.

Figure 4A:
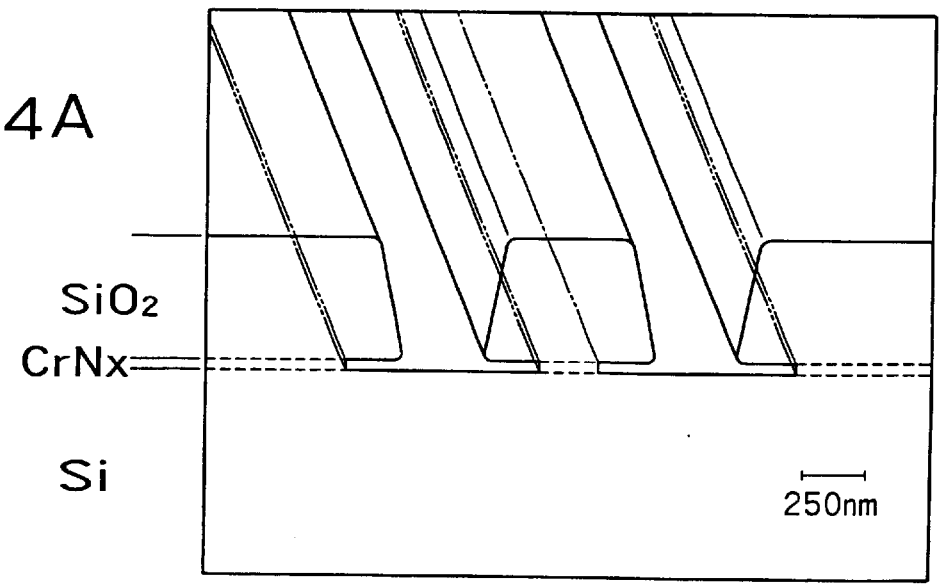
FIGS. 4A through 4C show enlarged images of a superfine pattern obtained by the third example, which were observed through a scanning electron microscope.
Figure 4B:
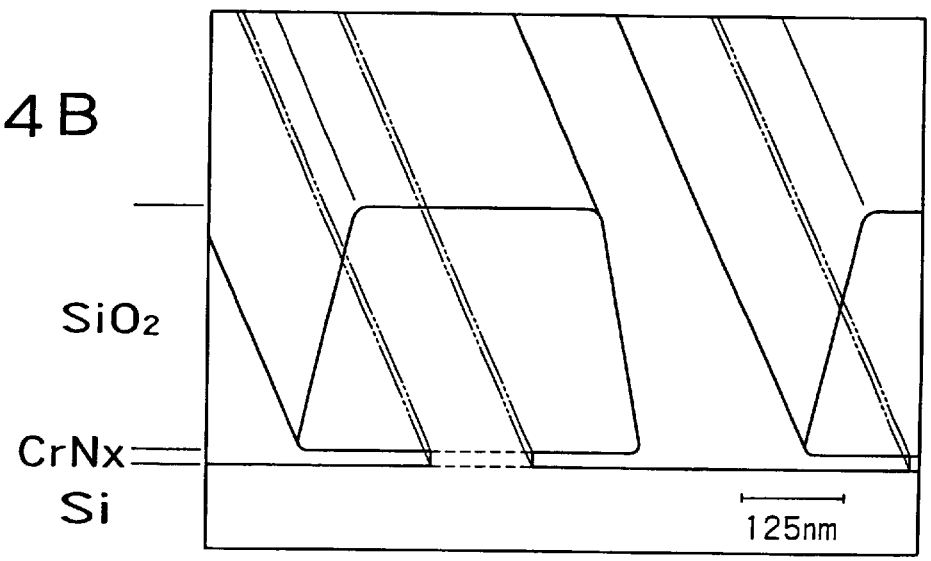
Figure 4C:
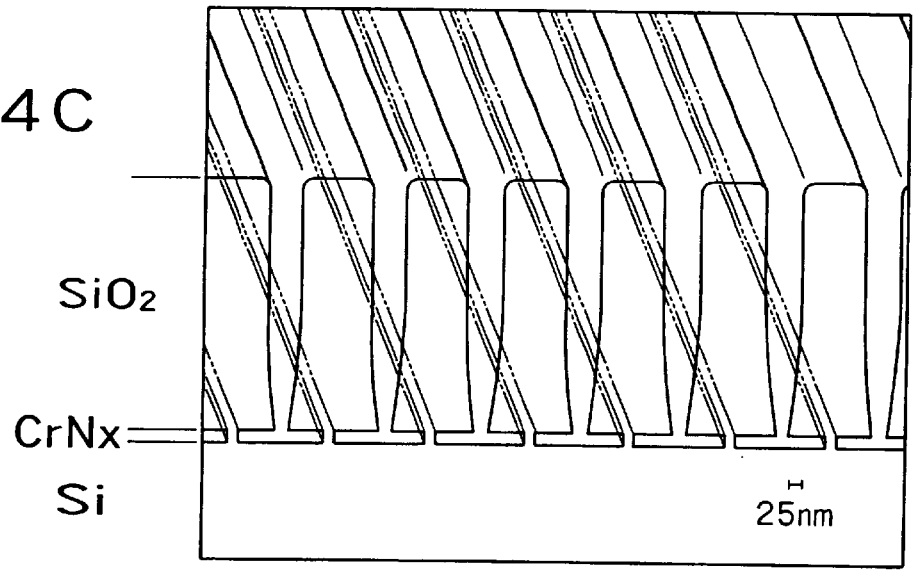

FIGS. 4A through 4C are enlarged diagrams of images of a super-fine pattern obtained by the same example, which were observed through a scanning electron microscope. As shown in these diagrams, in any portions of the $CrN_x$ film 1 where oxygen gas could touch, all grooves including extremely fine grooves, were side-etched. That is, it is indicated that, according to the embodiment, reaction products resulting from chemical etching of metallic nitride films by oxygen are highly volatile.

The reason why the $CrN_x$ film located under the resist mask 3 was side etched is considered to lie in that part of the implanted hydrogen ions spread in the $CrN_x$ film over the peripheral region underlying around the opening of the resist mask 3 and the $SiO_2$ film 6 in the step shown in FIG. 3C. While the etching rate by oxygen plasma for CrN film underlying the openings of the resist mask 3 was 7.5 nm/minute, the etching rate of the $CrN_x$ film under the resist mask 3 was 2.9 nm/minute. This difference in etching rate is considered to reflect the difference in amount of contained hydrogen. By increasing the irradiation time of hydrogen plasma, side etching can be promoted even under the $SiO_2$ film 6.

In order to prevent the $CrN_x$ film 1 located under the resist mask 3 from being etched by oxygen, the spreading of the hydrogen ion may be reduced. That is, the condition of the implantation may be controlled so that the straightforward implantation of hydrogen ions could be obtained. Alternatively, the antenna output of oxygen plasma may be decreased to lower the etching rate. By restricting etching by any of these methods, a structure free from side etching as shown in FIG. 3D can be fabricated.

The microstructure pattern of the $CrN_x$ film according to the example was analyzed by X-ray photoelectron spectroscopy (XPS), secondary ion mass spectrometry (SIMS), X-ray diffraction (XRD) and transmission electron microscopy. As a result, even after various kinds of plasma processing using hydrogen-containing gas and oxygen gas, no change was observed in composition profile of constituent elements other than hydrogen and in crystalline structure in the $CrN_x$ film 1, and it was confirmed that damages by irradiation such as defects or dislocation was not induced. That is, it was confirmed that no change was brought about in optical property, electric property or mechanical property in compound layers used as masks.

Furthermore, for the purpose of reviewing the effects of implantation of hydrogen ions into the $CrN_x$ film 1 employed in the embodiment, the following five samples (A) through (E) were processed with oxygen plasma of the antenna output of 500 W (gas pressure: 0.7 Pa, flow rate: 100 sccm). Results of comparison of etching rates of $CrN_x$ films and Cr films are shown in Table 1.

A) $CrN_x$ film prepared by irradiating plasma of $CHF_3$ gas of the antenna output of 750 W and the bias output of 300 W (gas pressure: 0.6 Pa, flow rate: 100 sccm) on the surface of $CrN_x$ film for 30 seconds;

B) $CrN_x$ film prepared by irradiating plasma of $SF_6$ gas of the antenna output of 750 W and the bias output of 300 W (gas pressure: 0.6 Pa, flow rate: 100 sccm) on the surface of $CrN_x$ film for 30 seconds;

C) Cr film prepared by irradiating plasma of $CHF_3$ gas of the antenna output of 750 W and the bias output of 300 W (gas pressure: 0.6 Pa, flow rate: 100 sccm) on the surface of Cr film for 30 seconds;

D) $CrN_x$ film prepared without plasma processing; and

E) Cr film prepared without plasma processing.

TABLE 1

|   | Etching rate by oxygen plasma |
|---|---|
| A) CrN ($CHF_3$-30s) | 7.4 nm/min. |
| B) CrN ($SF_6$-30s) | 1.0 nm/min. |
| C) Cr ($CHF_3$-30s) | 0.3 nm/min. |
| D) CrN (bulk) | 1.1 nm/min. |
| E) Cr (bulk) | 0.2 nm/min. |

By comparing etching rates of samples A and B, the effect of hydrogen-containing gas is confirmed. Further, by comparing etching rates of samples A and C, a difference is observed between the $CrN_x$ film and the Cr film, and it is appreciated that selective etching of the $CrN_x$ film and the Cr film is possible.

As explained above, it is appreciated that a photomask with a desired high accuracy can be fabricated by dry etching using the hydrogen ion implantation effects of the $CrN_x$ film.

The mask fabricated by the embodiment has the following advantages.

First, when the $CrN_x$ film containing Cr as its major component is etched by the etching method by oxygen plasma to use the $H^+$ ion effect, since the $CrN_x$ film is etched by chemical etching with highly volatile reactive products, the micro-loading effect is suppressed as compared with the existing conventional etching method using chlorine compound gas, and enhancement of CD controllability can be expected.

In case of photomasks for optical lithography, with reduced pattern size, it is necessary to make a much smaller opaque pattern like serifs and jogs for optical proximity repair, or make a phase shift mask, particularly such as Levenson phase shift mask. Since the aspect ratio of the opaque pattern is high, it is difficult to control the size, the shape and the CD uniformity of patterns with a high accuracy when using conventional methods using wet etching or dry etching in the manufacturing process. However, by making a photomask by the etching method according to the example, it is possible to easily make a microstructure pattern with high accuracy inexpensively and to fabricate a high-performance phase shift mask.

Second, hydrogen-containing gas and oxygen gas can be used for etching in lieu of chlorine compound gas heretofore in existing conventional dry etching methods of films containing Cr as their major component. Therefore, the method according to the example is advantageous in enabling easy and safe fabrication of a microstructure pattern.

Although the foregoing example has been explained as using sputtering for deposition of the film, it is also possible to use CVD (chemical vapor deposition), or the like.

Furthermore, gases containing hydrogen other than $CHF_3$, $CF_x+H_2$ and $NH_3$ indicated above are also usable in the plasma processing using a hydrogen-containing gas. Moreover, it is possible to control the etching rate and pattern configuration of the $CrN_x$ film by hydrogen plasma by changing the antenna output and the bias output. Similarly, configuration after etching can be also changed by changing the antenna output or applying a bias upon irradiation of oxygen plasma.

Further, etching rate and configuration of the $CrN_x$ film can be changed also by adding a gas like $N_2$, $Cl_2$, $H_2$ or the like, in addition to oxygen, in the oxygen plasma processing.

Additionally, in the explanation made above, although the compound has been written as $CrN_x$, the composition ratio x representing its composition is not limited to 1, the embodiment is similarly applicable to chromium nitride films of other composition ratios. Furthermore, the embodiment is similarly applicable also to various kinds of nitrides such as CrCN and CrCON, for example, as compounds containing chromium (Cr) and nitrogen (N).

Furthermore, the silicon oxide ($SiO_2$) film 6 used in the instant example to fabricate the Levenson phase shift mask may be replaced with another film that transmits hydrogen ions and is more preferably made of a material easy to remove.

Fourth Example

Next explained is the fourth example of the invention, which is a method of repairing defects in a photomask using a chromium compound layer.

Figure 5A:
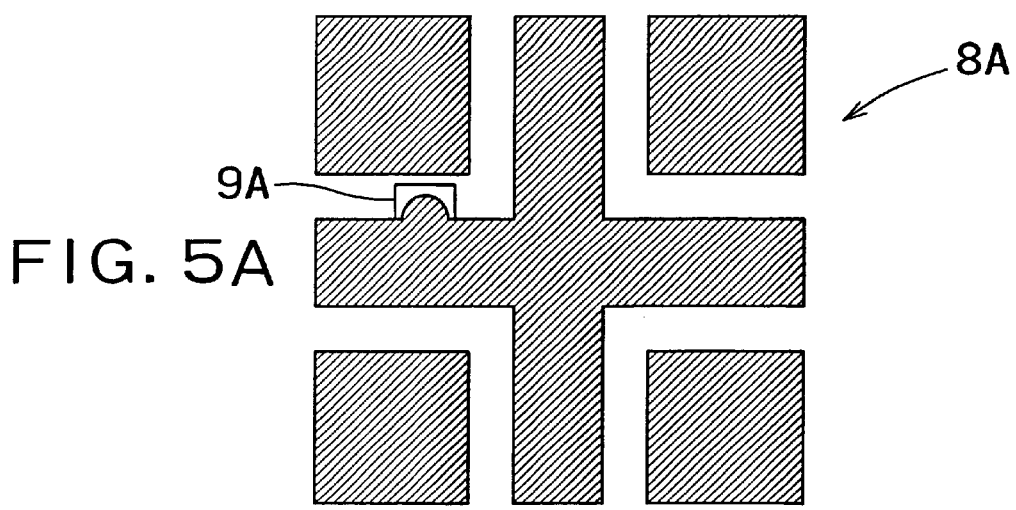
FIGS. 5A through 5C are diagrams that show the concept of a method of repairing defects in a photomask containing Cr as a opaque film material.
Figure 5B:
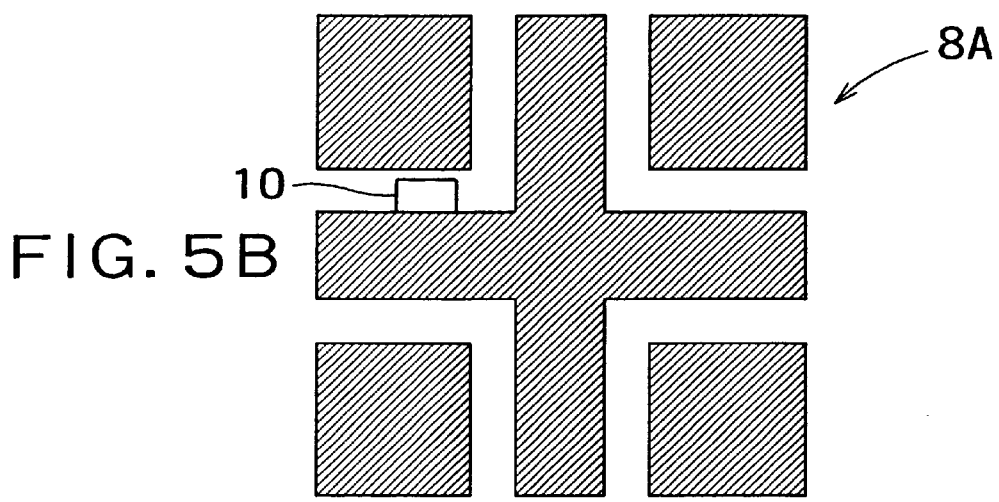
Figure 5C:
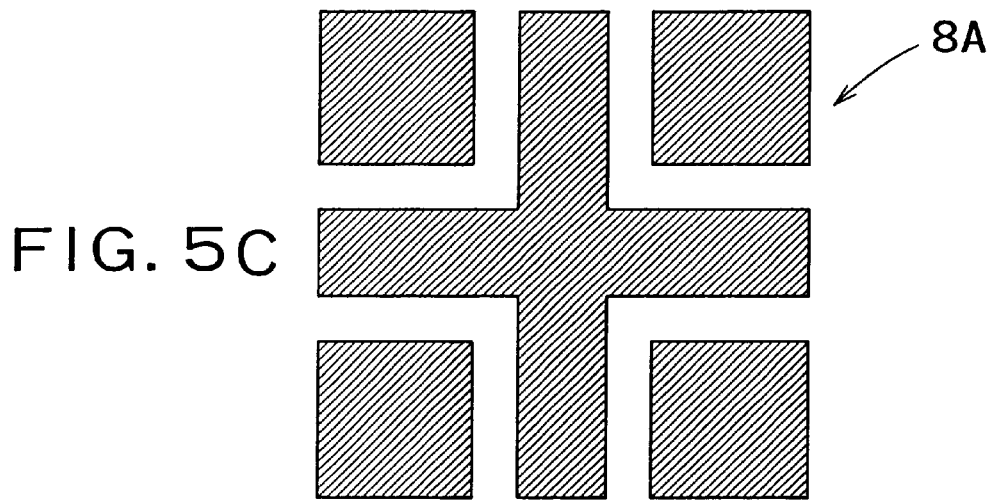

First explained is a method of repairing defects in a photomask made of chromium, with reference to FIGS. 5A through 5C.

FIG. 5A is a diagram that shows a opaque defect 9A has been made of a residue of a chromium (Cr) film in a part of a photomask pattern 8A of chromium (Cr) in its fabricating process.

A nitrogen and hydrogen ion beam of 60 keV is irradiated onto the opaque defect 9A by ion implantation to nitrify chromium (Cr) at the defect portion, and hydrogen is introduced additionally.

As a result, as shown in FIG. 5B, a $CrN_z$ region 10 plenty of implanted hydrogen ions is formed.

After that, a plasma of oxygen and $SF_6$ of antenna output of 500 W (gas pressure: 0.7 Pa, flow rate: 100 sccm) is irradiated. As a result, the only portion of $CrN_x$ film forming the opaque defect 9A is selectively etched, and the opaque defect 9A is removed and repaired as shown in FIG. 5C.

In this way, defects of the photomask made of chromium (Cr) can be repaired.

Figure 6A:
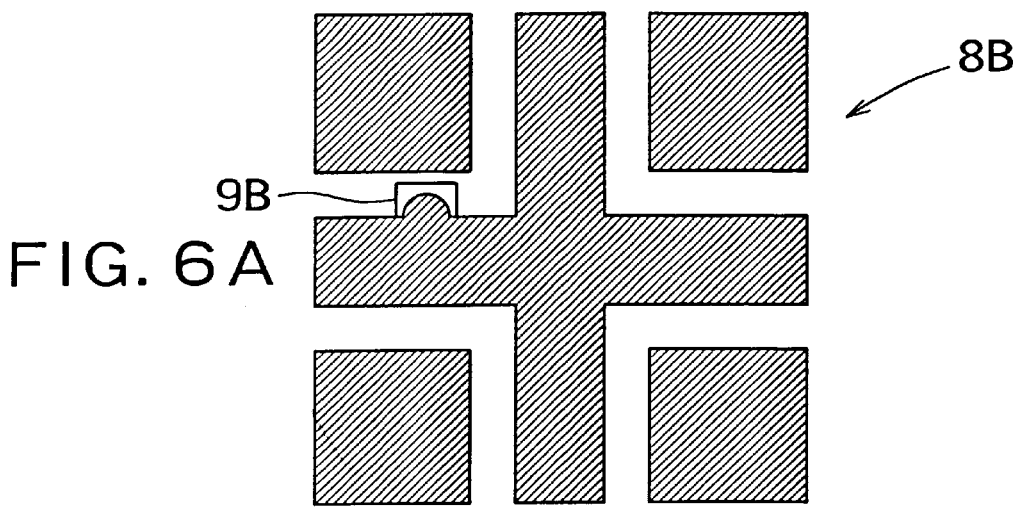
FIGS. 6A through 6C are diagram that show the concept of a method of repairing defects in a photomask containing $CrN_x$ as a opaque film material.
Figure 6B:
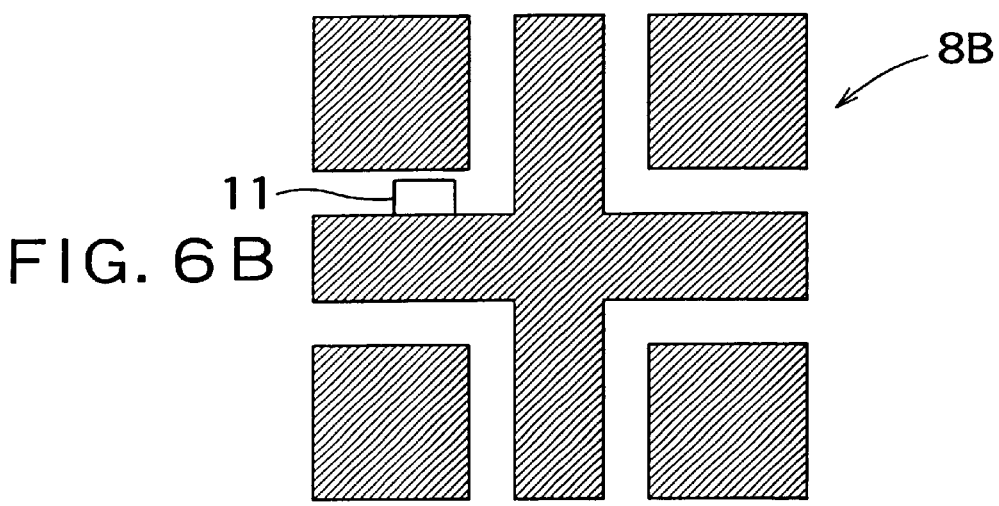
Figure 6C:
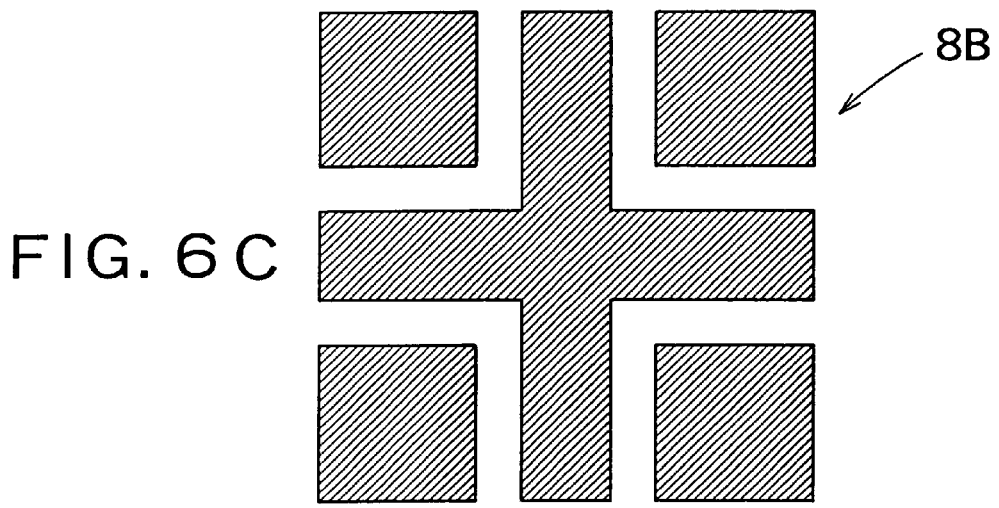

Next explained is a method of repairing defects in a photomask using $CrN_x$ as the material of a opaque film, with reference to FIGS. 6A through 6C.

FIG. 6A is a diagram that shows a opaque defect 9B has been made of a residue of a chromium (Cr) film in a part of a photomask pattern 8B of chromium nitride ($CrN_x$) in its fabricating process.

A hydrogen focused ion beam of 60 keV is irradiated on the opaque defect 9B on photomask by ion implantation to form a hydrogen implanted region 11 as shown in FIG. 6B.

Then plasma of oxygen and $SF_6$ of antenna output of 500 W (gas pressure: 0.7 Pa, flow rate: 100 sccm) is exposed on photomask. As a result, the only portion of the $CrN_x$ film forming the opaque defect 9B is selectively etched, and the opaque defect 9B is removed and repaired.

According to the method explained above, upon repairing defects in a photomask, reticle using a chromium (Cr)-based film or in various kinds of circuit boards, high-accuracy repair is ensured without damaging portions other than the defects.

This example for repairing defects in a pattern also utilizes that the etching rate of the $CrN_x$ film implanted with hydrogen ions by oxygen plasma is much higher than that of the CrNx film with no hydrogen ion implantation. Further, also in the defect repair according to the instant example, even after various kinds of plasma processing using hydrogen-containing gas and oxygen gas, no change was observed in composition profile of constituent elements other than hydrogen and in crystalline structure in the chromium (Cr) film or $CrN_x$ film, and it was confirmed by X-ray photoelectron spectroscopy (XPS), secondary ion mass spectrometry (SIMS), X-ray diffraction (XRD) and transmission electron microscopy that damages by irradiation such as defects or dislocation was not induced and that no change was brought about in optical property, electric property or mechanical property in compound layers used as masks.

Figure 7:
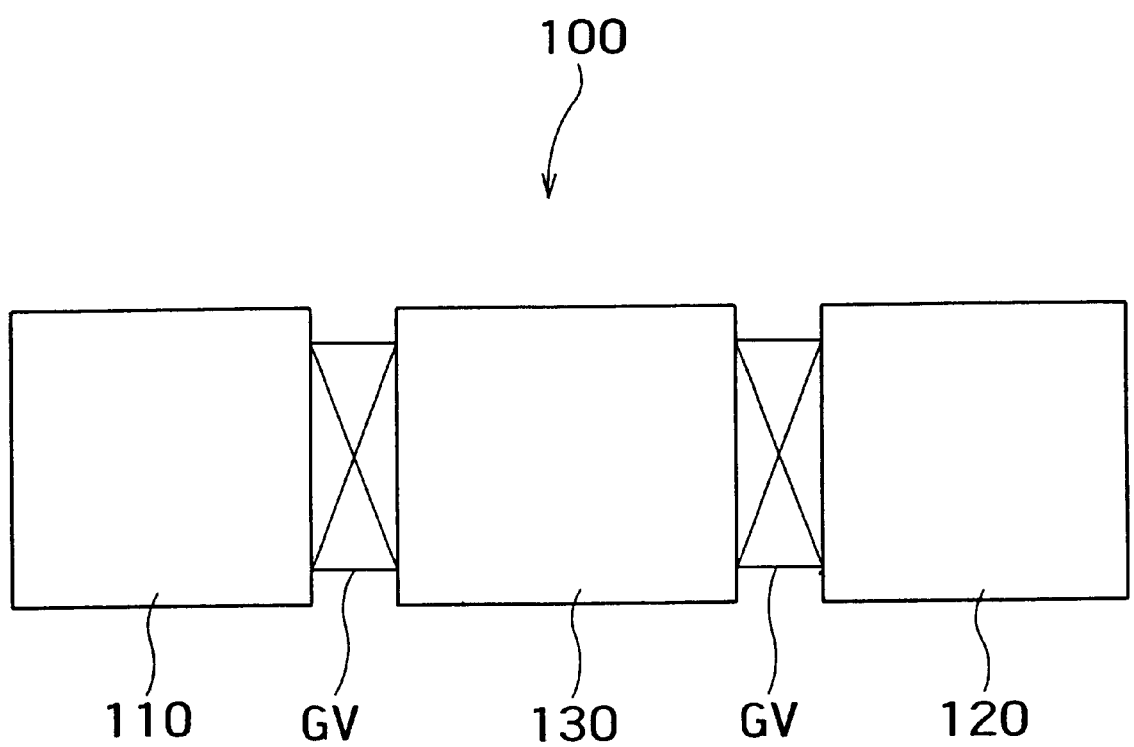
FIG. 7 is a diagram that shows the concept of a defect repairing device for executing a defect repairing method, taken as the fourth example according to the same embodiment.

FIG. 7 is a diagram that shows the concept of a defect repairing device for executing a defect repairing method according to the instant example. That is, the device 100 may be made up of a focused ion beam irradiation chamber 110, oxygen-containing plasma irradiation chamber 120, and an preparation chamber 130.

The focused ion beam irradiation chamber 110 is for irradiating a hydrogen-containing ions beam focused onto the target, and it can irradiate a nitrogen-containing ions focused beam, when necessary.

The oxygen plasma irradiation chamber 120 is for irradiating oxygen-containing plasma onto the substrate. It is preferable to use a mixed gas including oxygen and halogen gas as the source of the plasma.

The preparation chamber 130 has the function of loading/unloading photomasks packed in a cassette, or the like, to be processed and loading/unloading them to or from respective operations chambers.

These chambers are connected and each can be shut by gate valves GV.

Figure 8:
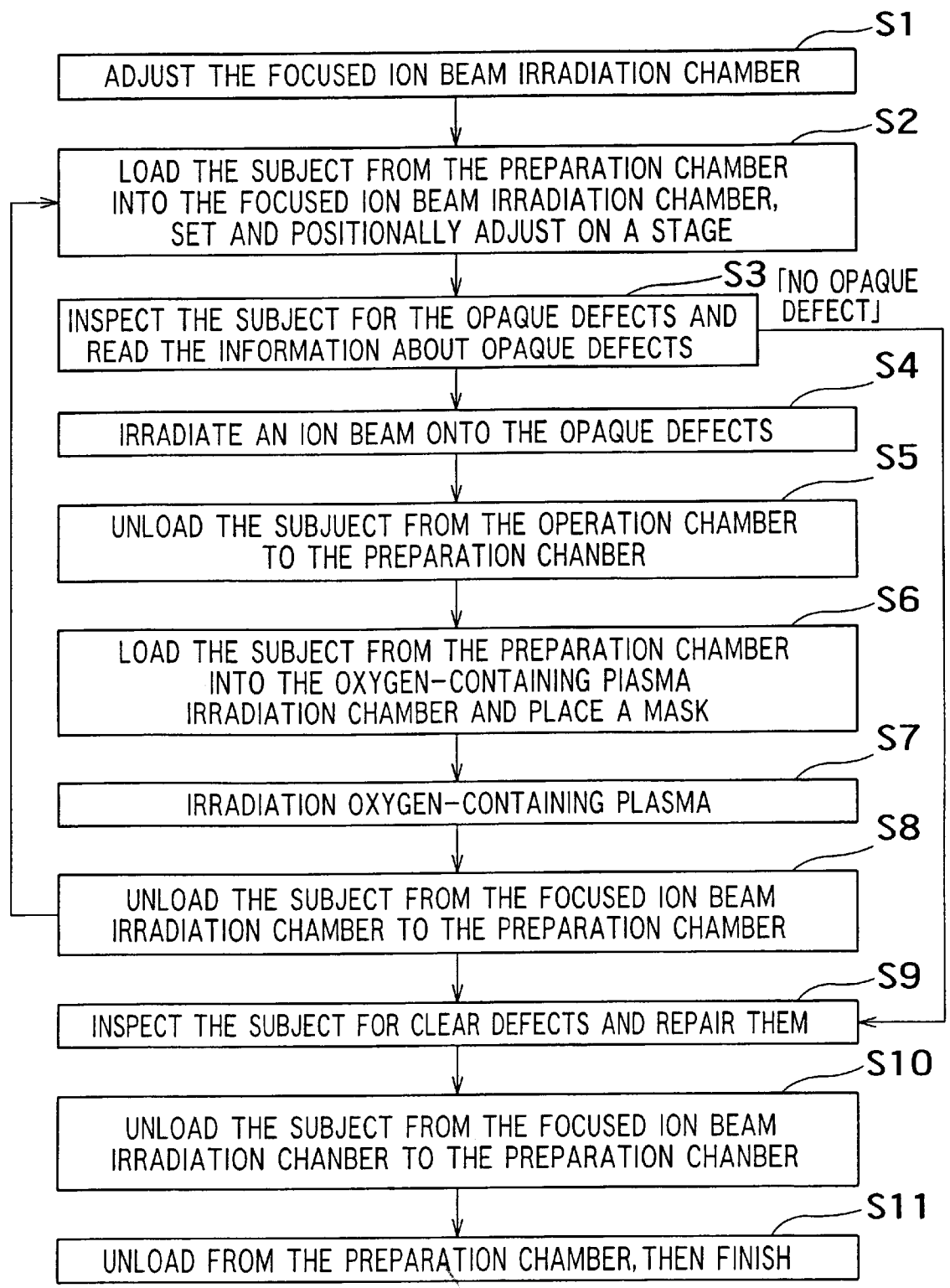
FIG. 8 is a flow chart that shows a process flow for the defect repairing device according to the same embodiment.

FIG. 8 is a flow chart that shows a process flow for the defect repairing device.

In step S1, the focused ion beam irradiation chamber 110 is adjusted. More specifically, the probe current, optical axis and focus of the ion beam, and so on, are adjusted.

In step S2, each of photomasks packed in a cassette to be processed is transported from the preparation chamber 130 into the focused ion beam irradiation chamber 110, set and positionally adjusted on a stage.

In step S3, the actual circuit pattern is compared and tested with CAD data which is the data on the design of the mask pattern circuit, and information about opaque defects is read out.

Based on the opaque defect information obtained in step S3, an ion beam is irradiated onto defects in step S4. After that, the subject is unloaded from the operation chamber 110 to the preparation chamber 130 in step S5.

In step S6, the subject is loaded from the preparation chamber 130 into the oxygen plasma irradiation chamber 120 and set therein, and oxygen plasma is irradiated onto it in step S7.

After that, in step S8, the subject is unloaded from the operation chamber 120 to the preparation chamber 130.

The flow next returns to step S2 to again load the subject into the focused ion beam irradiation chamber 110, and in step S3, the actual circuit pattern is again compared with CAD data of the designed mask pattern circuit to read out opaque defect information from it.

If opaque defects are already repaired, the flow moves to step S9, to execute inspection and repair of clear defects. After repair of clear defects, the subject is unloaded from the operation chamber 110 to the preparation chamber 130 in step S10, and then extracted from the preparation chamber 130 in step S11. Thus a series of repair process is completed.

Regarding repair of clear defects, they can be repaired by locally irradiating a focused ion beam of hydrogen while blowing an organic gas only onto the defects and depositing a carbon film on the clear defects in the focused ion beam irradiation chamber 110 of the same device 100, similarly to the case of opaque defects. Through these steps, photomasks free from defects can be shipped.

The method of repairing defects according to the embodiment have been confirmed to have the following two advantages.

One of the advantages is to ensure high-accuracy repair without damaging portions other than defects of the pattern. Unlike the existing method of removing defects by sputtering using irradiation of a focused Ga$^+$ ion beam, the embodiment does not damage the base substrate.

In the repair method using an ion beam according to the embodiment, the repair accuracy is determined by scattering of the beam and spreading of secondary electrons. However, in case of an ion beam, energy of the secondary electrons does not affect the accuracy largely. Therefore, in case of light element ions like hydrogen ions, the repair accuracy is determined by their dispersion in the film, hydrogen ions do not disperse widely at the high energy of 60 keV, and back scattering from the base substrate of the pattern can be disregarded. Therefore, the extension of their diversion is only about 10 to 20 nm. The repair method using a hydrogen ion beam for the hydrogen ion implantation effect of the $CrN_x$ film and a high repair accuracy, ensures highly accurate repair for Cr-based photomasks.

The other of the advantages is to ensure easy and inexpensive repair of defects on photomasks and various kinds of microstructure patterns.

Although the instant example has been explained as using ion implantation in the process of nitrifying the Cr film, it is also possible to use a laser doping method by focusing laser light in an atmosphere of a nitrogen-containing gas, such as ammonium, for example. In this case, a KrF, ArF or F$_2$ excimer laser is preferably used, which can focus light into smaller area with a high output power for high-concentrated implantation.

In the explanation of the instant example, irradiation of a hydrogen ion beam has been explained only as means for repair of defects in the $CrN_x$ film. However, needless to say, it is also possible to use a hydrogen ion beam to fabricate a microstructure pattern of the $CrN_x$ film. Additionally, in the explanation made above, although the compound has been written as $CrN_x$, the composition ratio x representing its composition is not limited to 1, the embodiment is similarly effective to chromium nitride films of other composition ratios. Furthermore, the embodiment is similarly effective also to various kinds of nitrides such as CrCN and CrCON, for example, as compounds containing chromium (Cr) and nitrogen (N).

Fifth Example

Next explained is the fifth example of the invention, which is a method of fabricating a micro device using an exposure mask fabricated and repaired by the first to fourth examples. The "microstructure device" herein pertains to any of semiconductor chips, like integrated circuits, ULSI, etc., liquid crystal devices, micro machines, thin-film magnetic heads, and so forth. Here is taken a semiconductor device as an example.

Figure 9:
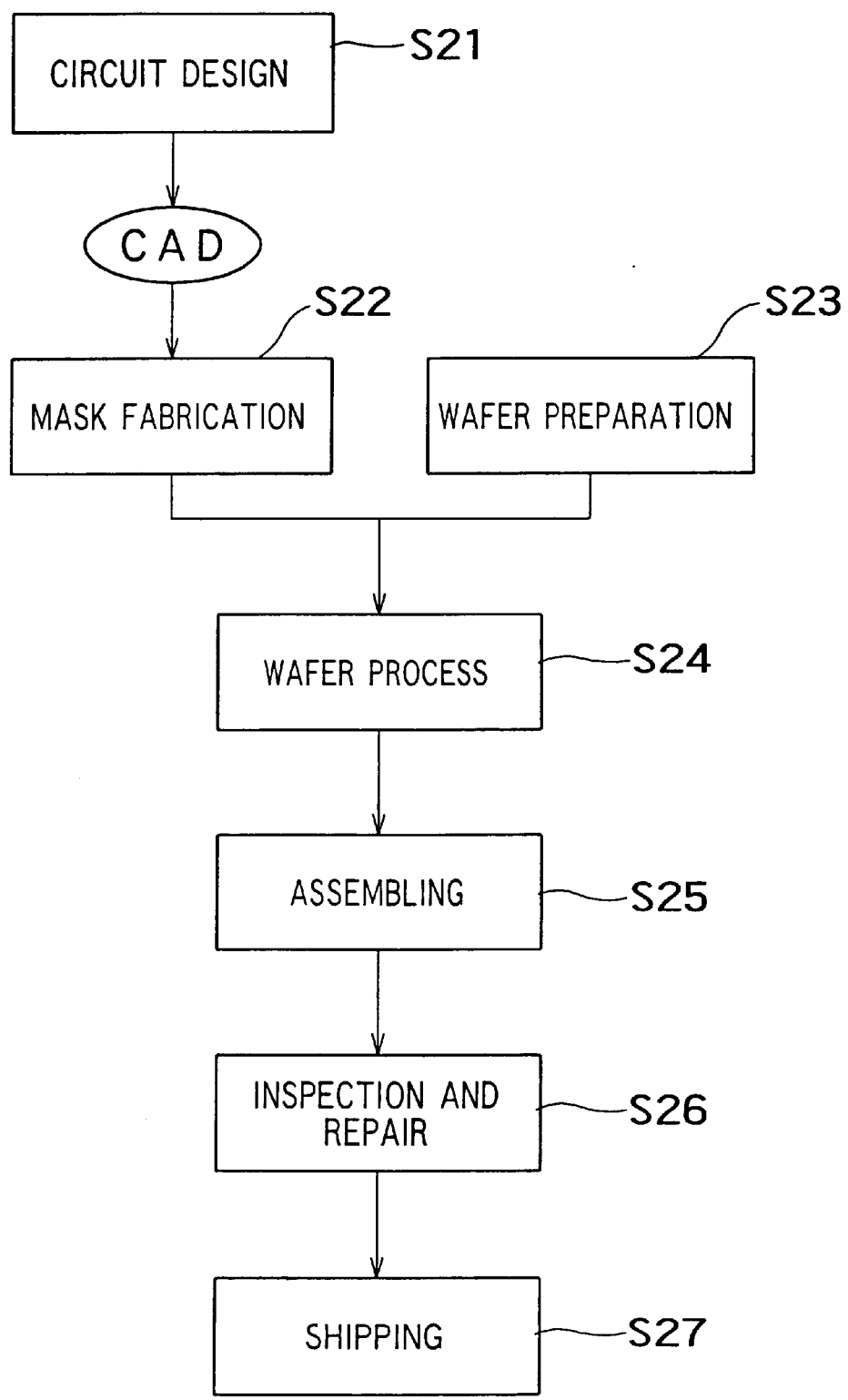
FIG. 9 is a flow chart that shows a manufacturing process of a semiconductor device.

FIG. 9 is a flow chart that shows a manufacturing process of a semiconductor device.

In step S21, the circuit of the semiconductor device is designed by using CAD, for example.

In step S22, a mask with the designed circuit pattern is fabricated. Simultaneously, instep S23, a wafer is manufactured by using a material such as silicon, for example.

In step S24, using the prepared exposure mask and wafer, the actual circuit pattern is transferred and formed on the wafer by a lithographic process. The lithographic process includes the steps of, for example, pretreatment processing, coating of a resist, pre-baking, exposure, post-exposure baking (PEB), development/rinsing, post-baking, etching, ion implantation, removal of the resist, inspection, and so on.

In the next step S25, as a secondary step, the wafer fabricated in step S24 is assembled into semiconductor chips. More specifically, assembling steps (dicing, bonding), packaging steps (steps of making chips), etc. are executed.

In the next step S26, the semiconductor device fabricated in step S25 undergoes tests and repair like operation test, durability tests, and so forth.

Through these steps, the semiconductor device is completed and shipped.

According to the instant example of the manufacturing method, by using an inexpensive exposure mask, the step of transfer and exposure can be made inexpensive, and inexpensive semiconductor devices or optical devices can be supplied.

Second Embodiment

Next explained is the second embodiment of the invention.

FIGS. 10A through 10D are cross-sectional views that show the concept of a process according to the second embodiment of the invention.

Figure 10A:
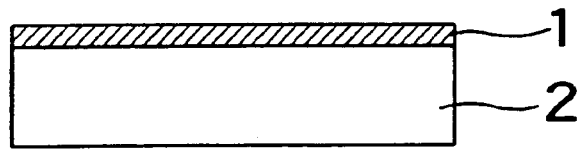
FIGS. 10A through 10D are cross-sectional views that show the concept of a process according to the second embodiment of the invention.

Here again, firstly, the nitride layer 1 is formed on the substrate 2 as shown in FIG. 10A.

Figure 10B:
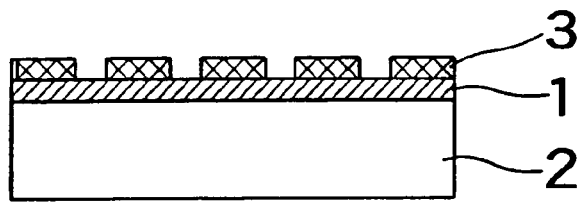

Next as shown in FIG. 10B, the resist mask 3 of a predetermined pattern is formed on the nitride layer 1. Usable as the material of the nitride layer 1 is, for example, chromium nitride, gallium nitride, or the like.

Figure 10C:
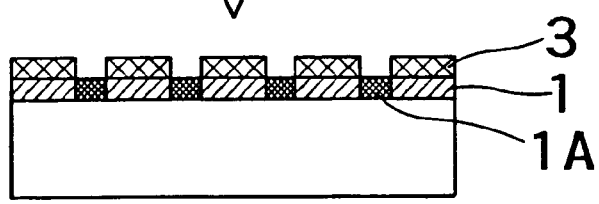

Next as shown in FIG. 10C, hydrogen 4 and halogen element 4' are implanted. Then, in this step, hydrogen 4 and halogen elements 4' are blocked by the mask 3, and they are selectively implanted into only portions of the nitride layer 1 through openings of the mask 3 to form hydrogen/halogen-implanted regions 1A.

Implantation of hydrogen 4 and halogen element 4' can be obtained by irradiating their plasmas as will be explained later by way of an example. At that time, incident angles of hydrogen 4 and halogen element ion beam to the substrate can be controlled by adjusting the plasma density, bias voltage, gas pressure, and others, and the pattern configuration of the nitride layer 1 by this etching method can be controlled. More specifically, if a pattern with rectangular shape is desired, the rectangular shape can be obtained by lowering the plasma density, enhancing the bias voltage and thereby implanting ions normally to the substrate.

The halogen used in this process may be fluorine, for example. Hydrogen 4 and halogen elements 4' may be implanted simultaneously, but need not be implanted simultaneously, and may be implanted independently.

Next as shown in FIG. 1D, an excited oxygen-containing gas 5, such as oxygen plasma, is irradiated. As a result, the resist mask 3 is removed, and selective portions of the nitride layer 11, where hydrogen 4 and halogen elements 4' have been implanted, are etched and removed. The reason why the nitride layer 1 is etched, possibly lies in highly volatile reactive products with a high equilibrium vapor pressure being generated as a result of interaction of the nitride layer 1A containing hydrogen and halogen ions with oxygen.

In the step shown in FIG. 10C, upon implantation of hydrogen 4 and halogen ions 4', their penetration into the nitride layer 1 under the resist pattern of mask 3 is prevented because the resist mask 3 is made of a light element. As a result, in the step shown in FIG. 10D, etching of the nitride layer 1 by $O_2$ plasma is not occurred. Since hydrogen 4 and halogen elements 4' (in particular, fluorine) with small masses, in the openings of resist pattern 3, they can intrude deeply into the nitride film 1.

Figure 10D:
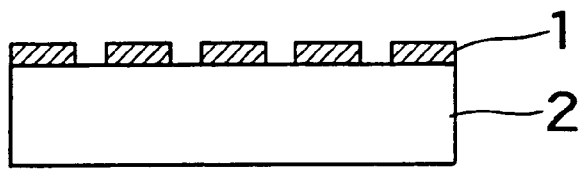

According to the concentration profile of hydrogen 4 and halogen elements 4' implanted into the nitride layer 1, the nitride layer 1 is etched by oxygen plasma processing 5 of FIG. 10D. Therefore, concentrations of hydrogen 4 and halogen elements 4' change rapidly at pattern edges, and result in making a rectangular pattern.

Etching used in the invention occurs as a result of implantation effects of hydrogen and halogen element, and the concentration profile of implanted elements, which is produced in the step of FIG. 10C, affects the pattern size and configuration, and even in the etching of FIG. 10D using oxygen gas. The micro-loading effect inherent to the existing etching methods is suppressed in this etching method.

As explained above, in the method according to the embodiment, the micro-loading effect, inherent to existing etching methods, is suppressed in the process of making a microstructure pattern of a nitride film by etching, and enhancement of CD controllability of pattern size can be expected.

Further, since the nitride film is etched by chemical etching with highly volatile reactive products, the invention can cope with further reduction of the pattern size to a less than 50 nm.

Additionally, by adjusting the gas pressure, bias output, or the like, in the process of plasma irradiation of a gas containing hydrogen and halogen elements, incident angles of hydrogen and halogen element ions to the substrate can be controlled so as to control the pattern configuration of the nitride film obtained.

Furthermore, upon repairing defects in photomasks and reticles using Cr compound films, or in various kinds of circuit boards having nitride film patterns, high-accuracy repairing is obtained without damaging portions other than the pattern defects.

At the same time, the invention enables fabricating exposure masks and various kinds of microstructure patterns easily and inexpensively.

The second embodiment will be explained below in greater detail with reference to the sixth to eighth examples.

Sixth Example

A microstructure pattern fabricating method of a CrN film and a TiN film will be explained below as the sixth example of the invention.

FIGS. 11A through 11F are cross-sectional views that roughly show central steps of making a CrN microstructure pattern used in this example.

In this example, two different processes A and B were executed.

As shown in FIG. 11A, in any of the processes A and B, a 100 nm thick CrN film 1 was deposited on a cleaned, 625 μm thick, 8-inch Si substrate 2 by using a reactive sputtering apparatus, Cr as the target material, and using a nitrogen/argon mixed gas under the pressure of 5 mTorr.

Next as shown in FIG. 11B, in any of the processes A and B, a $SiO_2$ film 6 and a resist mask 3 were formed. More specifically, first in a sputtering apparatus, the 500 nm thick $SiO_2$ film 6 was deposited by changing the target and the gas. After that, ZEP520 (Nippon Zeon), commercially available electron beam resist, was coated with a spin coater (not shown) at the spin velocity of 2000 rpm for 50 seconds. Then, through a baking process using a hot plate, a 350 nm thick photosensitive film was formed, and a pattern was written by using an electron beam writing apparatus of the acceleration voltage of 75 kV. For the purpose of obtaining a desired writing accuracy, multiple exposure method for forming a pattern by four-pass writing was employed, and optical proximity effect repair was executed by repairing the amount of irradiation. After the writing, through development, the resist mask 3 was made.

Next as shown in FIG. 11C, plasma of hydrogen 4 and fluorine gas 4' was irradiated.

In case of the process A, plasma of $CHF_3$ gas (gas pressure: 0.6 Pa, flow rate: 100 sccm) was irradiated with the antenna output of 600 W and the bias output of 300 W for three minutes, using an inductively coupled plasma (ICP) source.

In contrast, in the process B, plasma of $CHF_3$ gas (gas pressure: 0.6 Pa, flow rate: 100 sccm) was irradiated with the antenna output of 750 W and the bias output of 300 W for three minutes, using the ICP source.

As a result, as shown in FIG. 11D, selective portions of the SiO$_2$ film at the openings of the resist mask 3 were etched by three-minute plasma processing by CHF$_3$ gas to the surface of the CrN film 1, and the SiO$_2$ film was patterned.

At that time, in the process A, hydrogen 4 and fluorine 4' penetrate into selective portions of the CrN film 1 at the opening of the resist mask 3, and implanted regions 1A are formed. Ions of hydrogen 4 and fluorine 4' (in particular, hydrogen ions) with small masses intrude deeply into the SiO$_2$ film 6 and the CrN film 1 under the openings of the resist mask, whereas the resist could prevent the ions of hydrogen 1 and fluorine 4' from penetrating the SiO$_2$ film 6 and CrN film 1. This was confirmed by secondary ion mass spectrometry (SIMS).

On the other hand, in the process B, since the plasma density is increased and the mean free path of ions is shorter than that of the process A, directions of ions tend to deviate from the normal line to the substrate. As a result, as shown in FIG. 11D, hydrogen 4 and fluorine 4' penetrate also into portions of the CrN film 1 under the resist mask 3, and make wider implanted regions 1A.

Next as shown in FIG. 11E, oxygen plasma (gas pressure: 0.7 Pa, flow rate: 100 sccm) 5 was irradiated with the antenna output of 500 W to remove the resist mask 3 and etches the implanted regions 1A under the openings of the resist mask 3, thereby to obtain a pattern.

In the process A, even when the irradiation time of the oxygen plasma 5 was elongated to 60 minutes, there was no change in pattern size and configuration of the CrN film 1 as shown in FIG. 11F. In contrast, in the process B, a progress of side etching corresponding to the implanted regions of the CrN film 1 was confirmed as shown in FIG. 11F. This was the result of the directivity of ions during the CHF$_3$ gas plasma irradiation mentioned above.

Finally, by wet etching in a solution of ammonium fluoride, the SiO$_2$ film 6 was removed, thereby to obtain a microstructure pattern (not shown) of the CrN film 1.

Figure 12A:
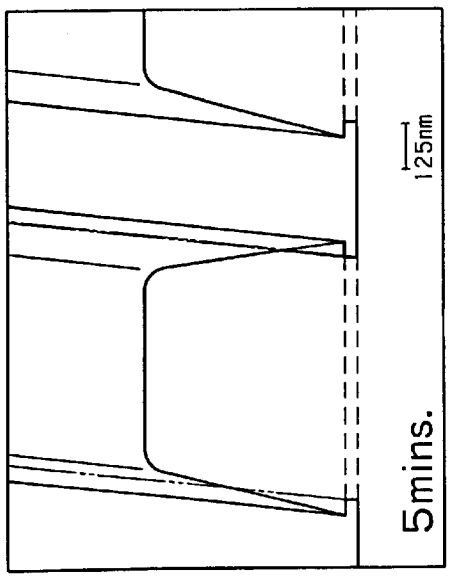
FIGS. 12A through 12D are enlarged images of patterns obtained by the process A and the process B in the sixth example, which were observed through a scanning electron microscope.
Figure 12B:
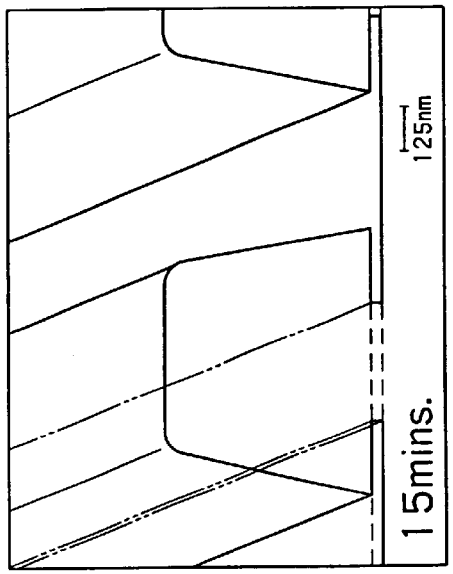
Figure 12C:
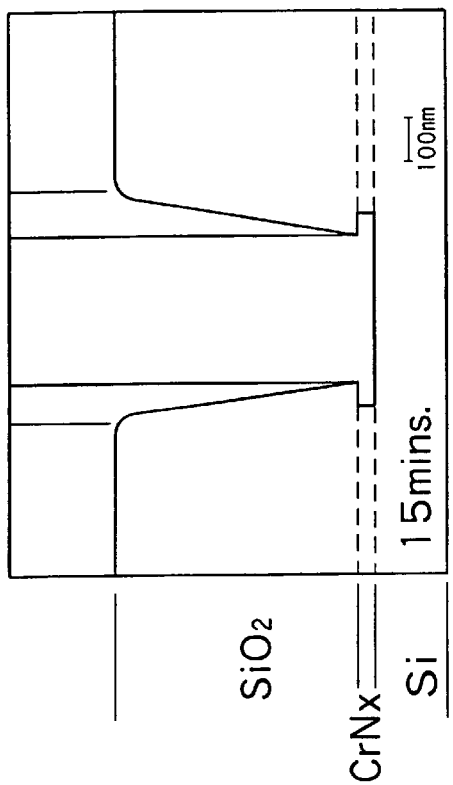
Figure 12D:
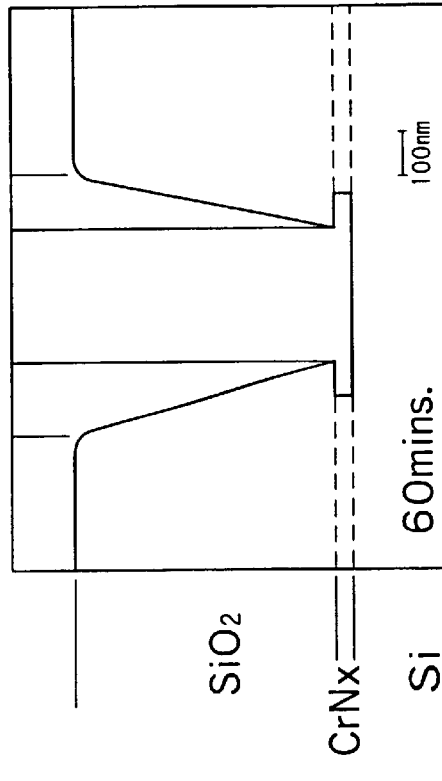

FIGS. 12A through 12D are enlarged diagrams of images of patterns obtained by the processes A and B, which were observed through a scanning electron microscope. FIG. 12A shows an enlarged image of an edge after irradiating oxygen plasma for 15 minutes in the process A, FIG. 12B shows that after irradiating oxygen plasma for five minutes in the process B, FIG. 12C shows that after irradiating oxygen plasma for 60 minutes in the process A, and FIG. 12D shows that after irradiating oxygen plasma for 15 minutes in the process B.

It was confirmed from these enlarged images that all grooves, including super fine pattern, could certainly be etched in the CrN film 1, in any portions where oxygen ions could interact. That is, it was confirmed that chemical etching with highly volatile reactive products occurred.

In case of the process A, side etching of the CrN film 1 was suppressed (FIG. 12C) even after oxygen plasma was irradiated for 60 minutes whereas, in case of the process B, side etching of CrN film was occurred at the implanted region under the SiO$_2$ film 26 (FIG. 12D) by irradiation of oxygen plasma only for 15 minutes. This is because wide implanted regions 1A with hydrogen 4 and fluorine 4' ions were made as explained above.

Next explained is a specific example in which a microstructure pattern of TiN film was made using the instant example.

FIGS. 13A through 13D are cross-sectional views that roughly show main steps for making a TiN microstructure pattern used in this example.

Figure 13A:
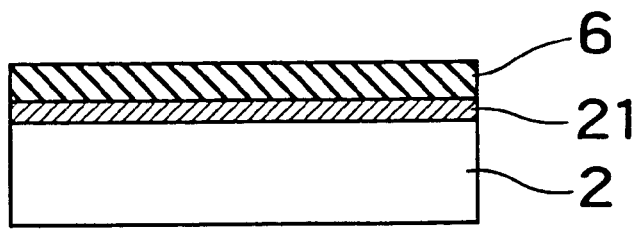
FIGS. 13A through 13D are cross-sectional views that roughly show a central portion of a process of making a TiN microstructure pattern used in the sixth example of the invention.

As shown in FIG. 13A, the same deposited structure as that of the sixth example was first formed. More specifically, a 100 nm thick TiN film 21 was deposited on a cleaned, 625 μm thick, 8-inch Si substrate 2 by using a reactive sputtering apparatus, Ti as the target material, and using a nitrogen/argon mixed gas under the pressure of 5 mTorr. Additionally, a 500 nm thick SiO$_2$ film 6 was deposited by changing the target and the gas.

Figure 13B:
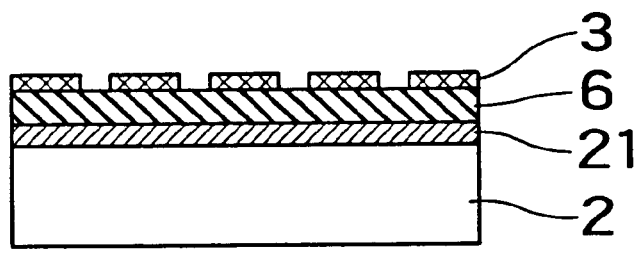

Next as shown in FIG. 13B, a resist mask 3 was formed. More specifically, ZEP520 (Nippon Zeon), commercially available electron beam resist, was coated with a spin coater at the spin velocity of 2000 rpm for 50 seconds. Then, through a baking process using a hot plate, a 350 nm thick resist film was formed, and a pattern was written by using an electron beam writing apparatus of the acceleration voltage of 75 kV. For the purpose of obtaining a desired writing accuracy, multiple exposure method for forming a pattern by four-pass writing was employed, and optical proximity effect repair was executed by repairing the amount of irradiation. After the writing, through development, the resist mask pattern 3 was formed.

Figure 13C:
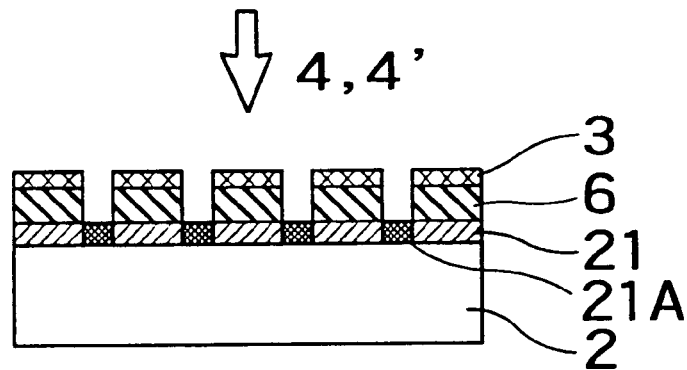

After that, as shown in FIG. 13C, hydrogen 4 and fluorine 41 were implanted. More specifically, in an ICP plasma etching apparatus, plasma of CHF$_3$ gas (gas pressure: 0.6 Pa, flow rate: 100 sccm) was irradiated with the antenna output of 600 W and the bias output of 300 W for three minutes. As a result, the SiO$_2$ film under the openings of the resist mask 3 were etched and implanted regions 21A with hydrogen 4 and fluorine 4' ions were formed in the underlying TiN film.

Figure 13D:
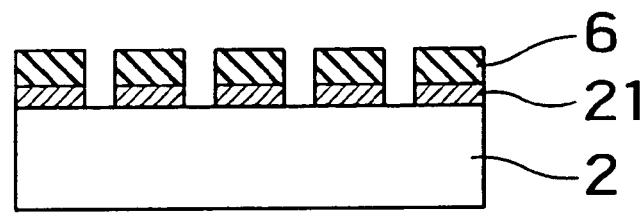

Next as shown in FIG. 13D, oxygen plasma was exposed. More specifically, oxygen plasma 5 (gas pressure: 0.7 Pa, flow rate: 100 sccm) was irradiated with the antenna output of 500 W for 15 minutes. As a result, the resist mask 3 was removed and the implanted regions 21A of the TiN film under the opening of the mask 3 were patterned. Finally, the SiO$_2$ film 6 was removed by wet etching in a solution of ammonium fluoride, thereby to obtain a microstructure pattern of the TiN film 21.

For the purpose of reviewing the effects of implantation of hydrogen and fluorine ions into CrN films and TiN films, the Inventor prepared the following seven samples (A) through (G) were processed with oxygen plasma of the antenna output of 500 W (gas pressure: 0.7 Pa, flow rate: 100 sccm), and compared etching rates CrN films, Cr films and TiN films.

A) CrN film prepared by irradiating plasma of CHF$_3$ gas of the antenna output of 750 W and the bias output of 300 W (gas pressure: 0.6 Pa, flow rate: 100 sccm) on the surface of CrN film for 30 seconds;

B) CrN film prepared by irradiating plasma of SF$_6$ gas of the antenna output of 750 W and the bias output of 300 W (gas pressure: 0.6 Pa, flow rate: 100 sccm) on the surface of CrN film for 30 seconds;

C) Cr film prepared by irradiating plasma of CHF$_3$ gas of the antenna output of 750 W and the bias output of 300 W (gas pressure: 0.6 Pa, flow rate: 100 sccm) on the surface of Cr film for 30 seconds;

D) CrN film prepared without plasma processing;

E) Cr film prepared without plasma processing;

F) TiN film prepared by irradiating CHF$_3$ gas plasma (gas pressure: 0.6 Pa, flow rate: 100 sccm) with the antenna output of 750 W and the bias output of 300 W on the surface of the TiN film; and G) TiN film without plasma processing.

Table 2 shows etching rates obtained when the samples A through G are exposed to oxygen plasma.

TABLE 2

| | Etching rate by oxygen plasma |
|---|---|
| A) CrN (CHF$_3$-30s) | 7.4 nm/min. |
| B) CrN (SF$_6$-30s) | 1.0 nm/min. |
| C) Cr (CHF$_3$-30s) | 0.3 nm/min. |
| D) CrN (bulk) | 1.1 nm/min. |
| E) Cr (bulk) | 0.2 nm/min. |
| F) TiN (CHF$_3$-30s) | 0.3 nm/min. |
| G) TiN (bulk) | 0.08 nm/min. |

By comparing etching rates of samples A and B, the effect of hydrogen implantation is confirmed. Further, by comparing etching rates of samples A and C, a difference is observed between the CrN film and the Cr film, and effectiveness of hydrogen implantation to nitride films is appreciated. That is, the method according to the invention has been confirmed to enable selective etching in CrN films and Cr films. Additionally, from comparison between the etching rates of the samples (F) and (G), the method according to the invention can be appreciated to be an etching method effective for nitrides containing an element other than Cr, as well.

In microstructure patterns of CrN films fabricated by the example shown above, even after various kinds of plasma processing, no changes were found in composition profile of constituent elements other than hydrogen and fluorine and in crystalline structure in the CrN film 1, and by X-ray photoelectron spectroscopy (XPS), secondary ion mass spectrometry (SIMS), X-ray diffraction (XRD) and transmission electron microscopy, it was confirmed that damages by irradiation such as defects or dislocation were not induced. That is, it was confirmed that no changes were brought about in optical property, electric property or mechanical property in compound layers used as photomasks.

Figure 14A:
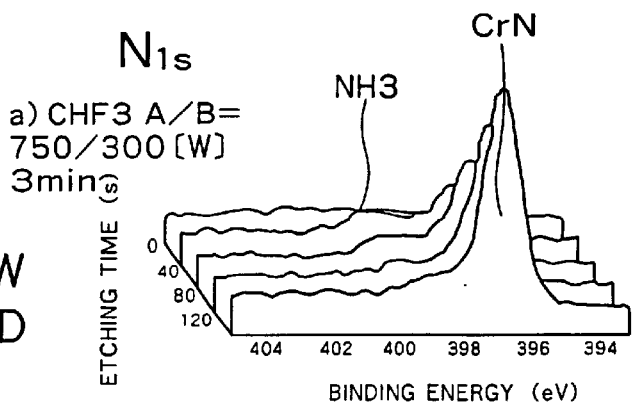
FIGS. 14A through 14C are graphs that show results of XPS analysis, which were obtained in the sixth example of the invention.
Figure 14B:
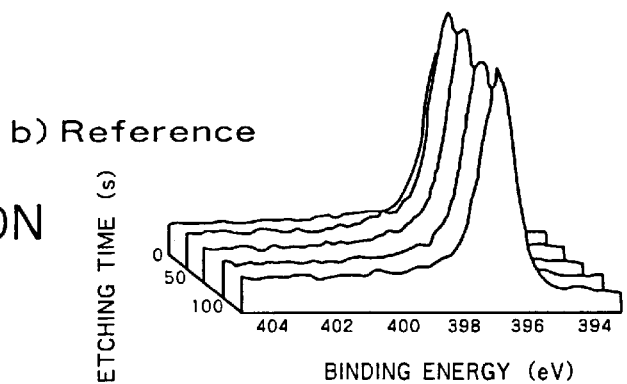
Figure 14C:
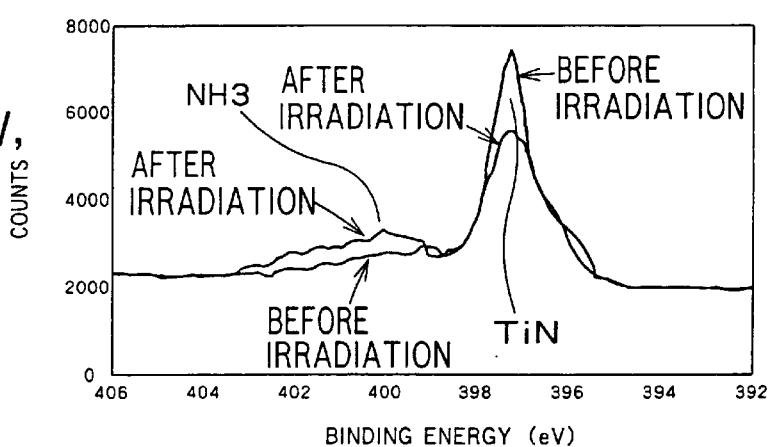

FIGS. 14A through 14C are graphs that show results of XPS analysis obtained in the instant example. FIG. 14A shows XPS data of the CrN film irradiated with CHF$_3$ gas plasma as a function of depth from surface, FIG. 14B shows XPS data of a non-processed CrN film prepared for comparison; and FIG. 14C shows XPS data of the TiN film irradiated with CHF$_3$ gas plasma as a function of depth from surface.

It will be appreciated from these graphs that, through XPS analysis, peaks of NH$_x$ indicating the binding of nitrogen and hydrogen were observed in the CrN film irradiated with CHF$_3$ gas plasma (FIG. 14A) and the TiN film (FIG. 14C) in the binding energy spectrum of nitrogen is and that hydrogen ions play an important role in etching of nitride films.

As explained above, according to the instant example, it is appreciated that a microstructure pattern with a desired high accuracy can be fabricated by dry etching using the hydrogen ion implantation effects of the nitride film. The microstructure pattern fabricating method according to the embodiment was confirmed to exhibit the following advantages.

One of the advantages is suppression of micro-loading effects inherent to existing conventional etching methods, and therefore provides a possibility of enhancing CD controllability of pattern size. That is, the etching method according to the invention utilizes the effect of ion concentration profile of hydrogen and fluorine implanted into the nitride film on the size and configuration of the subject to be processed. As a result, in a later oxygen etching process, etching of the nitride film is occurred in accordance with the concentration profile, and therefore, micro-loading effects inherent to existing conventional etching techniques are suppressed. Further, the nitride film is etched by chemical etching with highly volatile etching reaction products, and the method can be used for the fabrication of microstructure as 50 nm or below.

The second advantage is to make it possible to control incident angles of ions to the substrate by adjusting the plasma density, bias voltage, gas pressure, and/or other factors in the process of plasma irradiation of a gas containing hydrogen and fluorine, and thereby control the pattern configuration of the nitride film obtained. If a pattern with a rectangular shape is desired, desirable conditions for implanting ions normally to the substrate can be obtained by lowering the gas pressure, elongating the mean free path of ions and increasing the bias voltage to enhance the straightness.

In case of photomasks for optical lithography, with reduced pattern size, it is necessary to make a much smaller opaque pattern like serifs and jogs for optical proximity repair or make a phase shift mask, particularly such as Levenson phase shift mask. Since the aspect ratio of the opaque pattern is high, it is difficult to control the size, the shape and the CD uniformity of patterns with a high accuracy when using existing conventional methods using wet etching or dry etching in the manufacturing process. However, by making a photomask by the etching method according to the embodiment, it is possible to easily make a microstructure pattern with high accuracy inexpensively and to fabricate a high-performance phase shift mask.

Although this example uses the CrN film and the TiN film as nitride films, it has been confirmed that the invention is similarly effective also when used with other compounds containing Cr and N, namely, CrCN, CrCON and TiAlN. Although these materials have been written as "CrN" and "TiN" in the foregoing explanation, composition ratio in each compound is not limited to 1:1, but it will be need less to say that the invention is similarly effective for nitride films having other composition ratios.

Furthermore, since the interaction of nitrogen in the nitride film with implanted hydrogen and fluorine has a great contribution in this example, it will be appreciated that the invention is similarly effective also for other metallic nitrides, nitride semiconductors, and compound materials containing nitrogen.

Additionally, the SiO$_2$ film 6 used in the instant example is not indispensable for making a pattern of a nitride film, but patterning of a nitride film is possible also by making a resist mask directly on the nitride film.

Further, the SiO$_2$ film 6 used in the instant example is not limited to it, but it may be replaced with another film that penetrates a sufficient amount of hydrogen ions and can be removed easily.

The example has been explained as using a sputtering apparatus for deposition of films, but a CVD apparatus, for example, is also usable.

In the plasma processing employed in this example by using a fluorine-containing gas, gases containing hydrogen and fluorine other than CHF$_3$, CF$_x$+H$_2$ and NH$_3$ indicated above are also usable. The element to be combined with hydrogen need not be fluorine and may be any of other halogens. However, fluorine element with the smallest ion radius and mass will be the best.

Furthermore, although the instant example uses ICP as the plasma source, other usable apparatuses include RIE (reactive ion etching) apparatus, magnetron plasma apparatus, ECR-type RIE apparatus using electron cyclotron resonance, and plasma apparatus using a helicon plasma source. However, the ICP plasma source used in the instant example will be most advantageous in controllability of ion directivity because it has two sources, namely the source for generating plasma (plasma source) and the source pulling ions from the plasma onto a sample (bias source), and can independently control the density of the plasma and the bias potential to the sample.

Additionally, in the etching process by oxygen plasma in the instant example, the etching rate of the CrN film by oxygen plasma can be controlled by changing the antenna output. Similarly, by changing the antenna output of the oxygen plasma, the etched patterns shape can be changed as well.

Furthermore, in the etching process of the nitride film by oxygen plasma, if a bias output is also applied with antenna output, a metallic oxide film is formed on the surface of the nitride film, and etching of the nitride film by oxygen is largely restricted. Using this effect by bias application, it is possible to control the etching rate and pattern configuration of the nitride film, make a pattern, and repair defects.

In the oxygen plasma processing, it is of course possible to control the etching rate and pattern configuration of the CrN film by further adding a gas like $N_2$, $Cl_2$, $H_2$, etc.

Seventh Example

Next explained is the seventh example of the invention, which is a method of repairing defects in a photomask, reticle or any of various kinds of circuit boards using a Cr compound film.

Figure 15A:
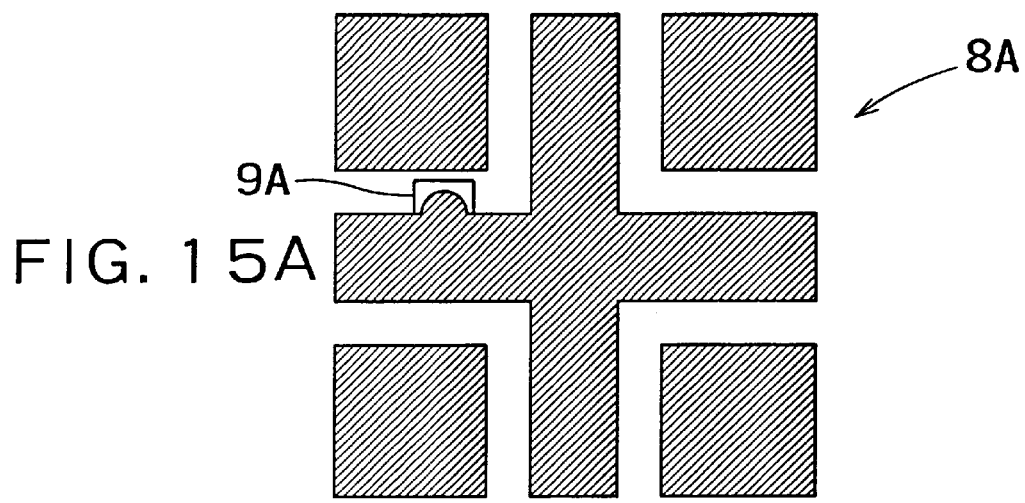
FIGS. 15A through 15C are diagrams that show the concept of a method of repairing defects in a photomask according to the seventh example of the invention.
Figure 15B:
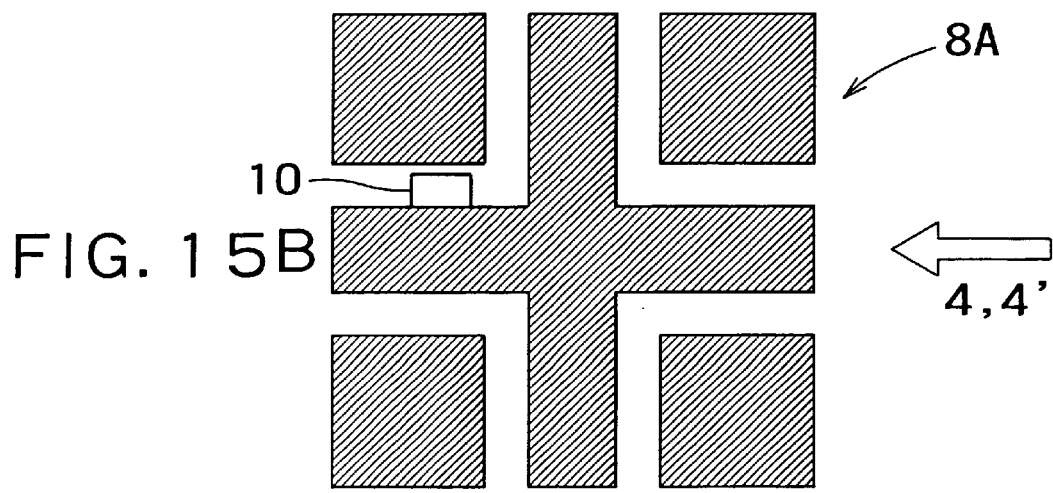
Figure 15C:
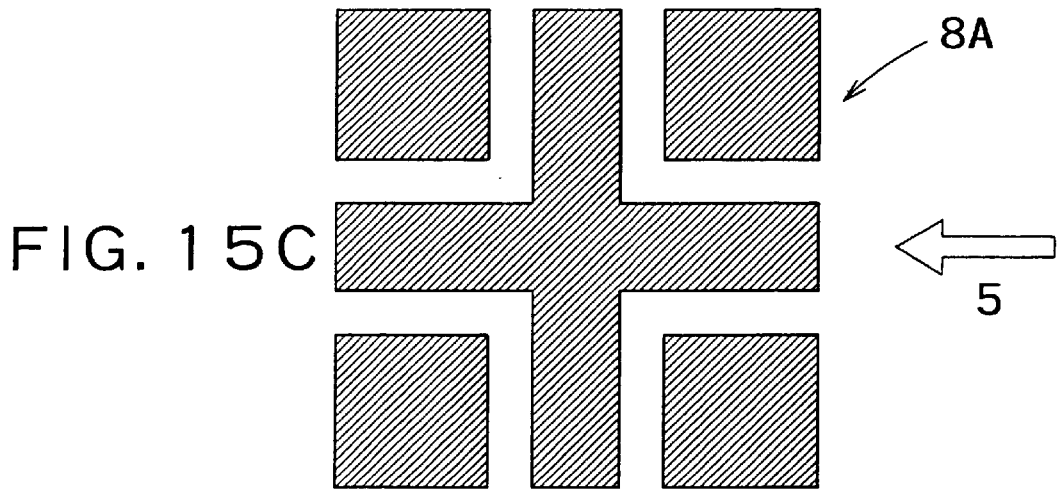

Explanation is first made about a method of repairing defects in a photomask using Cr as the material of a opaque film. FIGS. 15A through 15C are diagrams that show the concept of the defect repairing method of a photomask according to the instant example.

First as shown in FIG. 15A, in a process of making a Cr pattern 8A, nitrogen ions were implanted into the Cr film by irradiating a nitrogen ion beam of 60 keV onto a opaque defect 9A of a residue of the Cr film by ion implantation, thereby to modify the opaque defect 9A to a CrN film.

Next as shown in FIG. 15B, plasma of a gas containing hydrogen 4 and fluorine 4' was irradiated, thereby to form ion-implanted regions 10 with hydrogen and fluorine in the substrate. This process was conducted in an ICP plasma etching apparatus by radiating plasma of $CHF_3$ gas (gas pressure: 0.6 Pa, flow rate: 100 sccm) under the antenna output of 600 W and the bias output of 300 W.

After that, as shown in FIG. 15C, oxygen plasma 5 (gas pressure: 0.7 Pa, flow rate: 100 sccm) was exposed under the antenna output of 500 W. As a result, the only portions of the CrN film, which is the opaque defect 9A, was selectively etched, and the opaque defect was repaired.

Next explained is a method of repairing defects in a photomask using CrN as the material of a opaque film.

FIGS. 16A through 16C are diagrams that show the concept of the CrN photomask defect repairing method according to the second embodiment of the invention.

First as shown in FIG. 16A, a hydrogen ion focused beam of 60 kev was irradiated by ion implantation onto the opaque defect 9B of a residue of a CrN film in the process of making a CrN pattern 8B to implant hydrogen ions 4 by a high concentration into the film of the opaque defect.

Next as shown in FIG. 16B, fluorine ions were implanted into the substrate by plasma irradiation 4' of a fluorine compound gas not containing hydrogen. In this process, plasma of $SF_6$ gas (gas pressure: 0.5 Pa, flow rate 100 sccm) was irradiated under the antenna output of 600 W and the bias output of 300 W for 30 seconds in an ICP plasma etching apparatus.

Next as shown in FIG. 16C, oxygen plasma (gas pressure: 0.7 Pa, flow rate: 100 sccm) was irradiated under the antenna output of 500 W. As a result, the only portion of the opaque defect 9B in the CrN film, implanted with hydrogen and fluorine, was selectively etched, and the opaque defect was repaired.

As explained above, it has been confirmed that the invention ensures highly accurate repair without damaging when repairing defects of photomasks, reticles and various kinds of circuit boards using Cr compound films.

The instant example also utilizes the difference of oxygen etching rate between CrN films and Cr films, which are implanted with hydrogen and fluorine ions.

Also in case of repair of defects in the CrN film according to the instant example, even after irradiation of various kinds of plasma of gases containing hydrogen or oxygen gas no changes were found in composition profile of constituent elements other than hydrogen and fluorine, in crystalline structure in the CrN film, and by X-ray photoelectron spectroscopy (XPS), secondary ion mass spectrometry (SIMS), X-ray diffraction (XRD) and transmission electron microscopy. It was confirmed that damages by irradiation such as defects or dislocation were not induced. That is, it was confirmed that no changes were brought about in optical property, electric property or mechanical property in compound layers used as masks.

Figure 17:
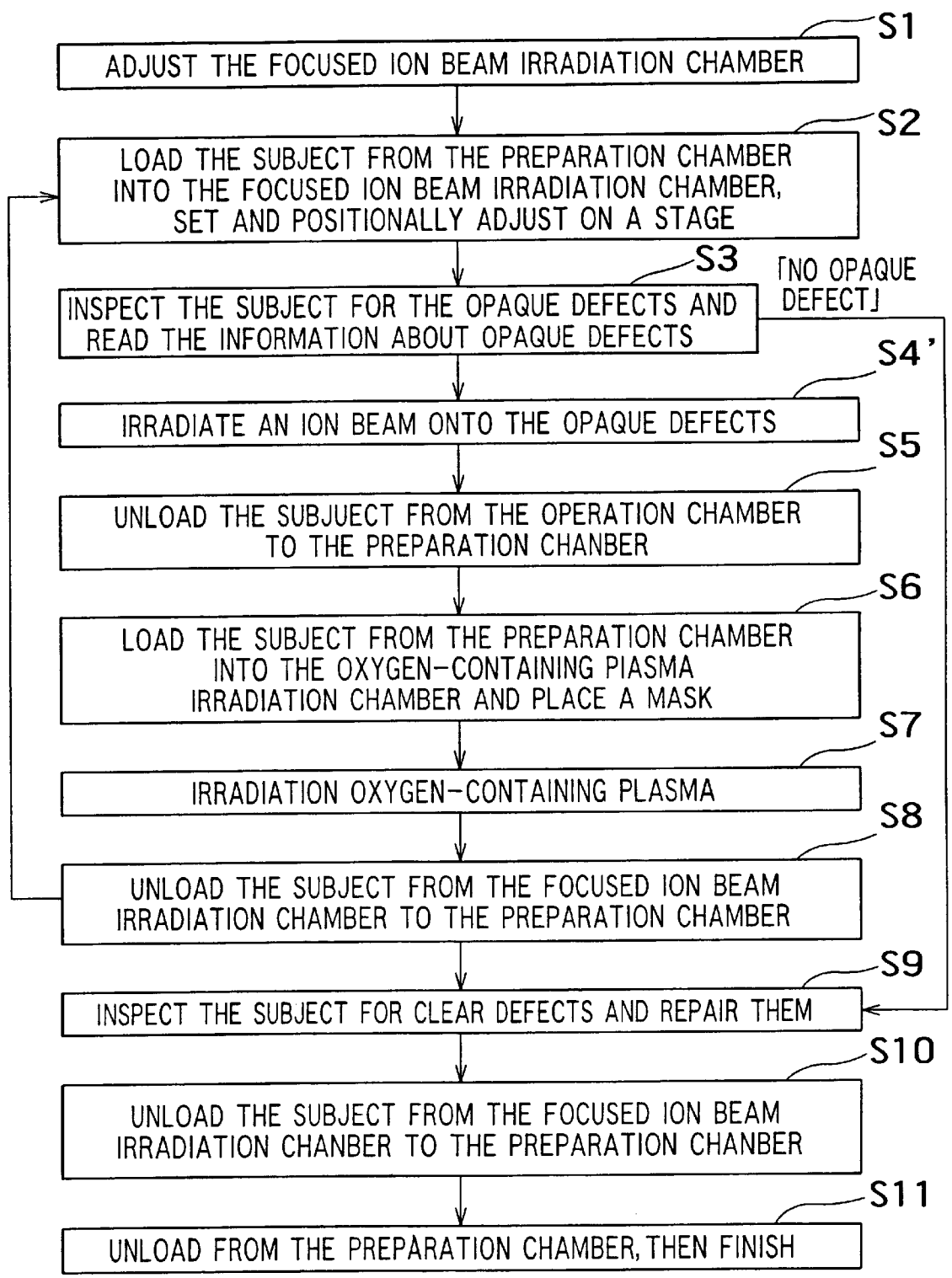
FIG. 17 is flow chart that shows the flow of the defect repairing method by the second example of the invention.

FIG. 17 is a flow chart that shows a process of the defect repairing method according to the instant example. In this flow chart, the same steps as those already explained with reference to FIG. 8 are labeled with common reference numerals, and their detailed explanation is omitted here.

A difference of the flow chart of the instant example from FIG. 8 is to irradiate an ion beam of a halogen element in addition to the hydrogen ion beam irradiation in step S4'. Fluorine is preferably used as the halogen element. The hydrogen ion beam and the halogen element ion beam may be irradiated simultaneously. However, their irradiation need not be at the same time, but may be irradiated separately.

Eighth Example

Next explained is a specific example in which a microstructure pattern of a GaN film was fabricated according to the second embodiment of the invention.

FIGS. 18A through 18D are cross-sectional views that roughly illustrate main steps of the instant example.

Figure 18A:
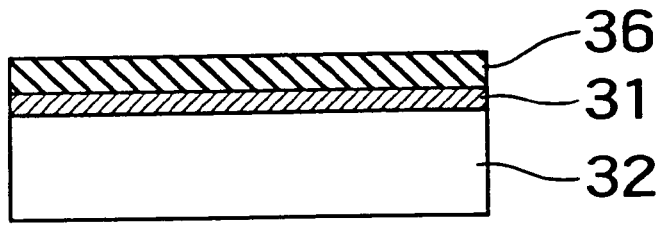
FIGS. 18A through 18D are cross-sectional views that roughly show a central portion of a process, taken as the eighth example of the invention.

First as shown in FIG. 18A, a multi-layered structure including a GaN film was formed. More specifically, a GaN film 31, approximately 1 μm thick, was deposited on a sapphire substrate 32 by MOCVD (metal-organic chemical vapor deposition) using TMG (trimethyl gallium) and $NH_3$ as main source material gases. Additionally, a 500 nm thick $SiO_2$ film 36 was deposited thereon by sputtering.

Figure 18B:
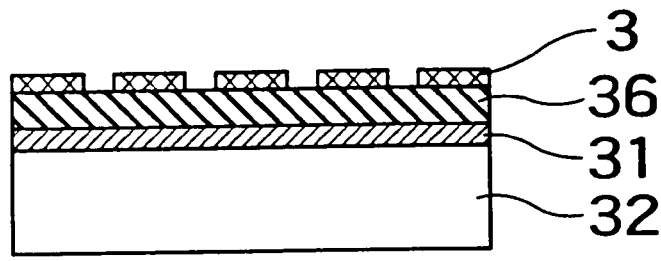

Next as shown in FIG. 18B, a resist mask pattern 3 was formed. Details of this step are the same as those already explained with reference to FIG. 13B.

Figure 18C:
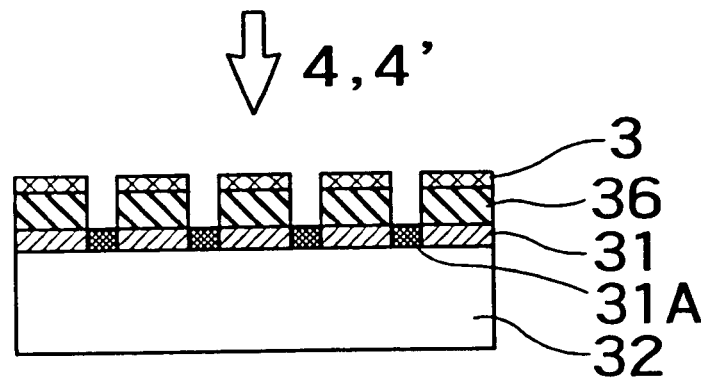

Next as shown in FIG. 18C, hydrogen 4 and fluorine 4' were implanted. More specifically, in an ICP plasma etching apparatus, plasma of $CHF_3$ gas (gas pressure: 0.6 Pa, flow rate: 100 sccm) was irradiated with the antenna output of 600 W and the bias output of 300 W for five minutes. As a result, selective portions of the $SiO_2$ film under the openings of the resist mask 3 were etched and implanted regions 31A with hydrogen 4 and fluorine 4' ions were formed in the underlying GaN film.

Figure 18D:
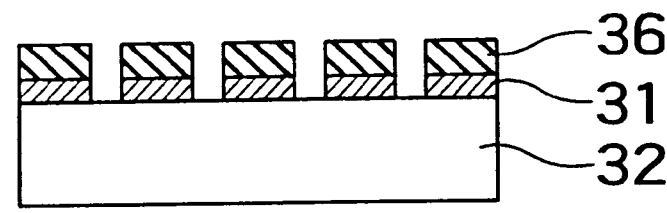

Next as shown in FIG. 18D, oxygen plasma was irradiated. More specifically, oxygen plasma 5 (gas pressure: 0.7 Pa, flow rate: 100 sccm) was irradiated with the antenna output of 500 W for 20 minutes. As a result, the resist mask 3 was removed and the implanted regions 31A of the GaN film under the opening of the mask 3 were patterned. Finally, the $SiO_2$ film 6 was removed by wet etching in a hydrofluoric acid-based solution, thereby to obtain a microstructure pattern of the GaN film 31.

The GaN film 31, obtained, was formed into a desired pattern, and it has been confirmed that the embodiment certainly makes it possible to reliably, easily realize patterning of gallium nitride compound semiconductors, which was not easy heretofore.

The pattern surface and side walls of the GaN film 31 after etching were observed through a scanning electron microscope. As a result, no etch pit was found and a smooth surface was confirmed. Further, composition of the GaN surface after etching was measured by Auger electron spectroscopy. As a result, ratio of Ga and N did not change from that prior to processing. This is probably because direct plasma irradiation onto the $SiO_2$ film 36 on the GaN film prevented the underlying GaN film 31 from damage by plasma irradiation. That is, it has been confirmed that the embodiment prevents degradation of the electric characteristics and optical characteristics due to irradiation damage that was inevitable in existing conventional plasma etching.

Although the invention has been explained, taking the GaN film as a specific, the invention ensures the same effects also when applied to etching of InN, AlN, InGaN, AlGaN, and so on.

Figure 19:
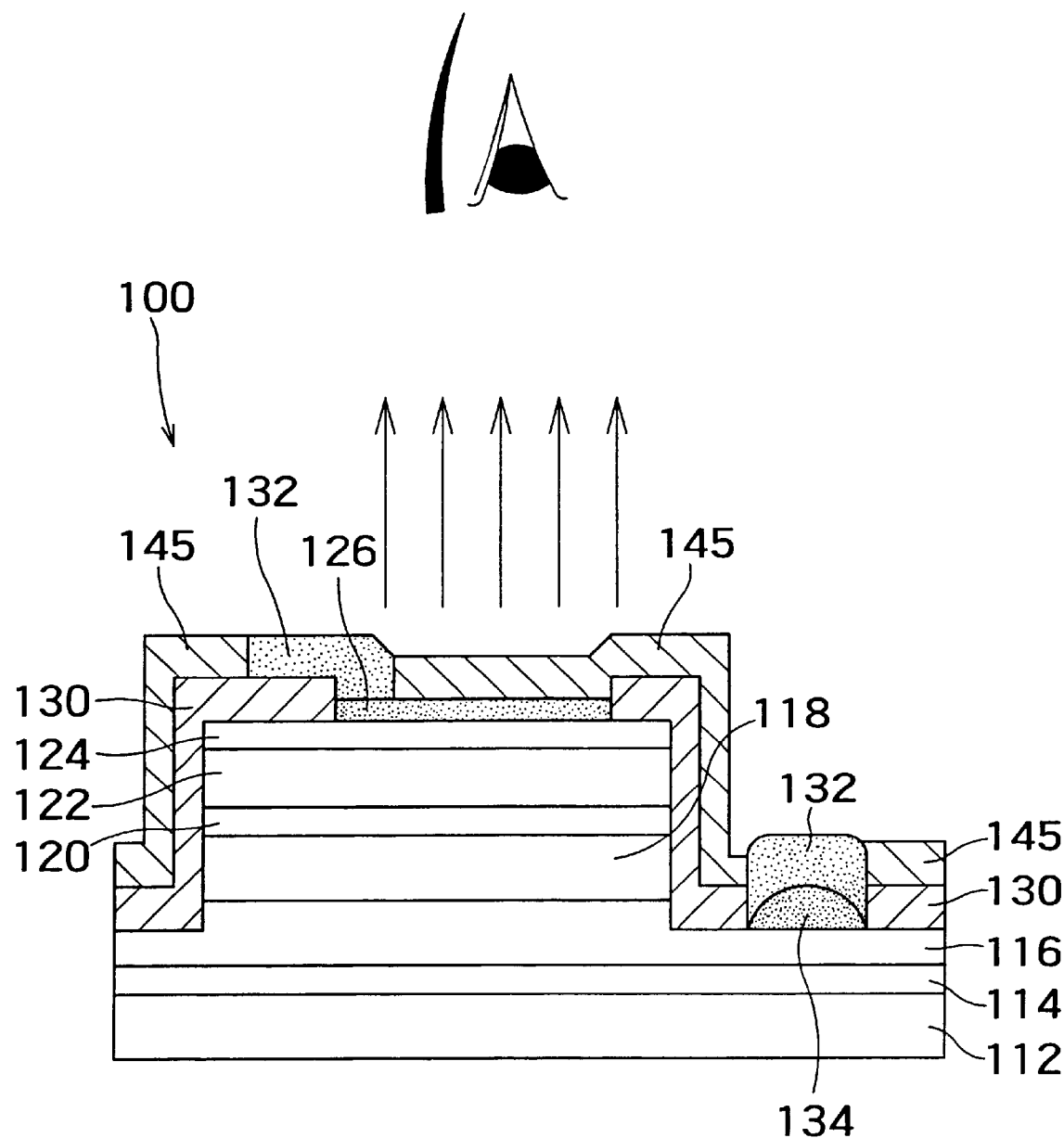
FIG. 19 is a diagram that shows the concept of a semiconductor device made by the invention.

FIG. 19 is a diagram that shows the concept of a semiconductor device that can be manufactured by a method according to the invention. That is, FIG. 19 shows a cross-sectional configuration of a gallium nitride-based light emitting diode. Its general configuration is explained below. That is, the light emitting element 100 has a multi-layered structure depositing semiconductors on a sapphire substrate 112. Deposited on the sapphire substrate are a buffer layer 114, n-type contact layer 116, n-type cladding layer 118, light emitting layer 120, p-type cladding layer 122 and p-type contact layer 124 in this order.

Material of the buffer layer 114 may be n-type GaN, for example. Then-type contact layer 116 is an n-type semiconductor layer with a high carrier concentration to ensure reliable ohmic contact with an n-side electrode 134. Its material may be GaN, for example. The n-type cladding layer 118 and the p-type cladding layer 122 have the role of confining carriers in the light emitting layer 120, and are required to have wider energy band gaps than the light emitting layer. Their material may be AlGaN having a wider band gap than the light emitting layer 120. The light emitting layer 120 is a semiconductor layer in which electric charges implanted as a current in the light emitting element recombine and generate light. Its material may be undoped InGaN, for example. The p-type contact layer 124 is a p-type semiconductor layer with a high carrier concentration to ensure reliable ohmic contact with a p-side electrode. Its material may be GaN, for example.

On the p-type contact layer 124, a p-side electrode layer 126 is deposited. On the n-type contact layer 118, an n-side electrode layer 134 is deposited.

On a location of the p-type contact layer 124, a current blocking layer 130 is formed. On the current blocking layer 130, a bonding pad 132 of Au is deposited, and a part thereof is in contact with the p-side electrode 126. A wire, not shown, is bonded to the bonding pad 132 to supply the element with a drive current.

The current blocking layer 130 has the role of preventing emission under the Au electrode 32. That is, in the light emitting element 100, light generated in the light emitting layer 120 is taken out upward through the electrode layer 126. However, because of a large thickness of the electrode, the bonding pad 132 cannot transmit light. Therefore, by providing the current block layer 130 not to implant the drive current to under the bonding pad 132, useless emission is prevented.

Also on the n-side electrode 134, a bonding pad 132 is deposited. The bonding pad 132 can be made by deposited Au film formation. Further, the surface other than the bonding pad 132 is covered with a silicon oxide layer 145.

The light emitting element 100 having the above-explained structure is mounted on a mount material such as lead frame, packaging substrate, etc., which are not shown, by bonding the bottom surface of the substrate 112 and bonding wires to the bonding pad, such that a drive current is supplied.

For fabricating the light emitting diode explained above, it is necessary to first make a wafer by sequentially depositing semiconductor layers 114 through 124 on the substrate 112 and thereafter locally expose the n-type contact layer 116 by patterning the wafer in order to make the n-side electrode 134. In this patterning process, the invention can be used. That is, it is possible to pattern the wafer made of nitride semiconductors and locally expose the n-type contact layer 116 by using the method already explained as the eighth example of the invention.

According to the invention, in the patterning step, a predetermined patterning configuration can be made reliably, easily, without damaging semiconductor layers.

The structure shown in FIG. 19 is not but an example among semiconductor devices that can obtained by the present invention. In addition to this, the invention can similarly make various other light emitting elements using nitride semiconductors, such as light emitting diodes and semiconductor lasers, photodetective elements, optical modulators, or various kinds of electronic devices, such as transistors and diodes, and appropriate combinations thereof.

Ninth Example

Next explained is a specific example in which a multi-layered air-gap interconnect structure (air-bridge wiring structure) in LSI having MOS transistors was fabricated as a ninth example of the invention.

FIGS. 20A through 20G are cross-sectional views that roughly illustrate main steps of the instant example.

Figure 20A:
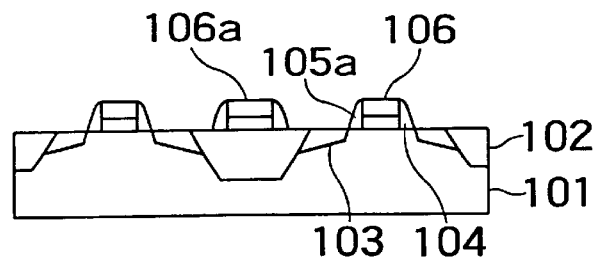
FIGS. 20A through 20G are cross-sectional views that roughly illustrate central steps of the instant example.

First as shown in FIG. 20A, trench isolation regions 102 are formed on a p-type silicon substrate 101. Then, MOS transistors having source-drain regions 103, side-walls 104, gate oxide film 105, gate electrode 106 and a gate wiring 106a are formed on the substrate 101.

Figure 20B:
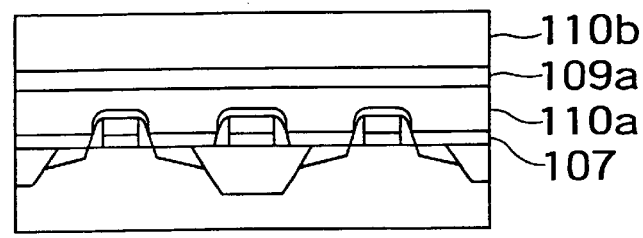

Next as shown in FIG. 20B, a covering layer 107, a SiON layer 110a (having a thickness of about 0.4 $\mu$m), lower SiO2 layer 109a (having a thickness of about 0.05 $\mu$m) and an upper SiON layer 110b (having a thickness of about 0.4 $\mu$m). The SiON layer 110a functions as a temporary layer for the formation of plug structure. The upper SiON layer 110b functions as a temporary layer for the formation of wiring layer.

Figure 20C:
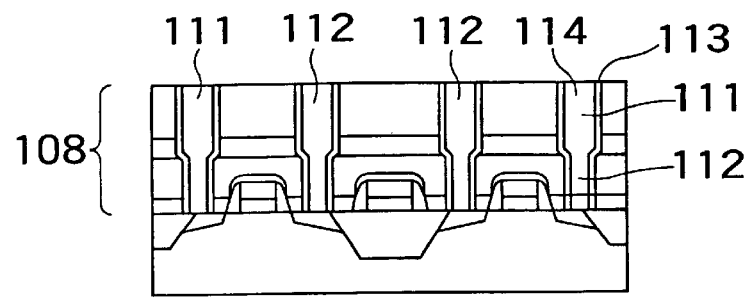

Next as shown in FIG. 20C, wirings 111 and plugs 112 are formed. More specifically, first, wiring grooves are formed in the upper SiON layer 110b by using the lower SiO$_2$ layer 109a as an etching stopper layer. Then, contact holes which extend from the bottom of the wiring groove to the source-drain region 103 through the lower SiO$_2$ layer 109a and the lower SiON layer 110a, are formed. An etching with fluoric gas is executed in order to make the contact holes, thus the fluorine is implanted into the SiON layers 110a and 110b.

Alternatively, the contact holes may be formed before the formation of the wiring grooves.

Then, a barrier metal film 113 and a copper alloy film 114 are deposited by sputtering, and the wiring grooves and the contact holes are plugged by the copper alloy by a re-flow process with an annealing at 400–500° C. Alternatively, the wiring grooves and the contact holes may be plugged by forming the copper alloy layer 114 by electroplating method.

Then, the remaining part of the barrier metal film 113 and the copper alloy film 114 which are left on the surface of the wafer without filling the wiring grooves and the contact holes are removed by polishing the surface of the wafer by CMP (chemical mechanical polishing) technique. As a result, the part of the barrier metal film 113 and the copper alloy film 114 which remain in the wiring grooves in the upper temporary SiON layer 110b, function as the wiring of the first wiring layer 108.

Similarly, the part of the barrier metal film 113 and the copper alloy film 114 which remain in the contact holes in the lower temporary SiON layer 110a, function as the plugs 112. These plugs 112 vertically connect the wiring 111 of the first wiring layer 108 with the source-drain region 103.

Figure 20D:
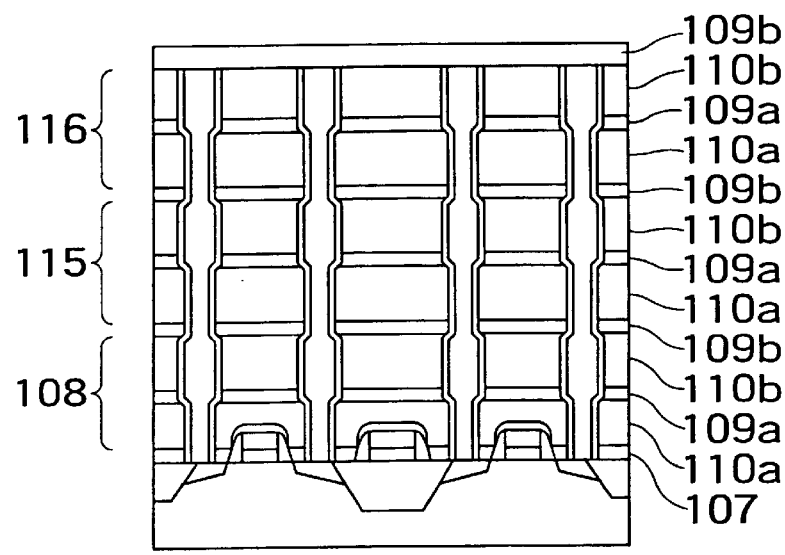

Next as shown in FIG. 20D, the similar structures are stacked. More specifically, the upper SiO2 layer 109a, the lower SiON layer 110a, the SiO2 layer 109a, the upper SiON layer 110b are deposited. Then, the wiring grooves and the contact holes are formed. Then, the barrier metal film 113 and the copper alloy film 114 are deposited and the re-flow process is executed. Then the CMP process is executed in order to remove the extra part of the films 113 and 114. By repeating the above-mentioned sequence specific times, the wirings 111 of the second interconnect layer 115 and the third interconnect layer 116, and the plugs 112 are formed. As the top layer, upper SiO2 layer 109b which functions as a protective layer is deposited.

Figure 20E:
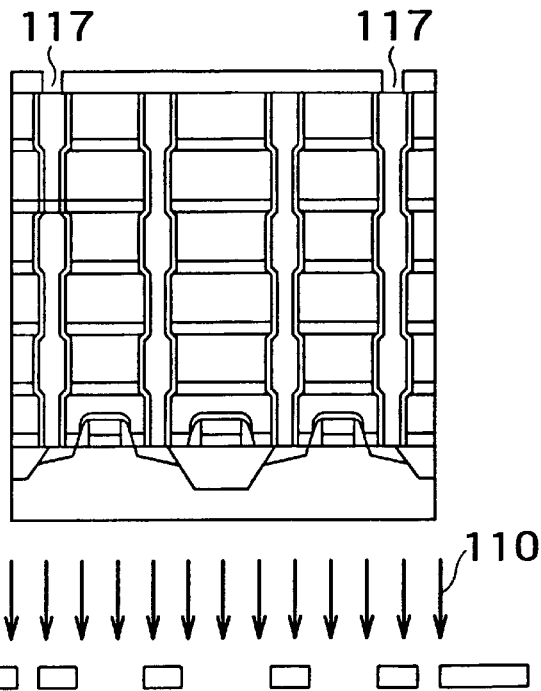

Next as shown in FIG. 20E, openings 117 are formed in the upper SiO2 layer 109b covering the top of the stacked structure. The openings 117 are formed so that the pad portions of the wirings 111 of the third interconnect layer (top wiring layer) 116 is exposed.

Figure 20F:
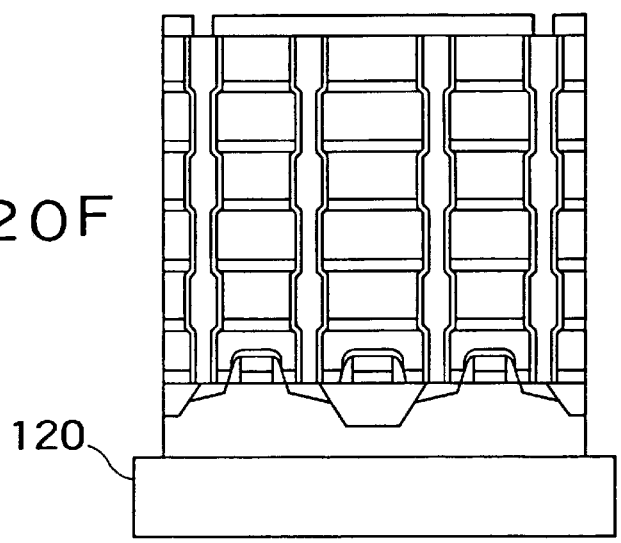

Next as shown in FIG. 20F, hydrogen 118 is implanted. Following are exemplary depths from the surface of the SiON layers 110a and 110b which function as the temporary layers for the first through third interconncect layers 108, 115 and 116 at this stage.

|  | layer 110a | layer 110b |
| --- | --- | --- |
| the first wiring layer | 2.3–2.7 $\mu$m | 1.85–2.25 $\mu$m |
| the second wiring layer | 1.4–1.8 $\mu$m | 0.95–1.35 $\mu$m |
| the third wiring layer | 0.50–0.90 $\mu$m | 0.05–0.45 $\mu$m |

In the step shown in FIG. 20F, the acceleration voltage for the hydrogen implantation is controlled in accordance with these depths of the layers 110a and 110b.

Figure 21:
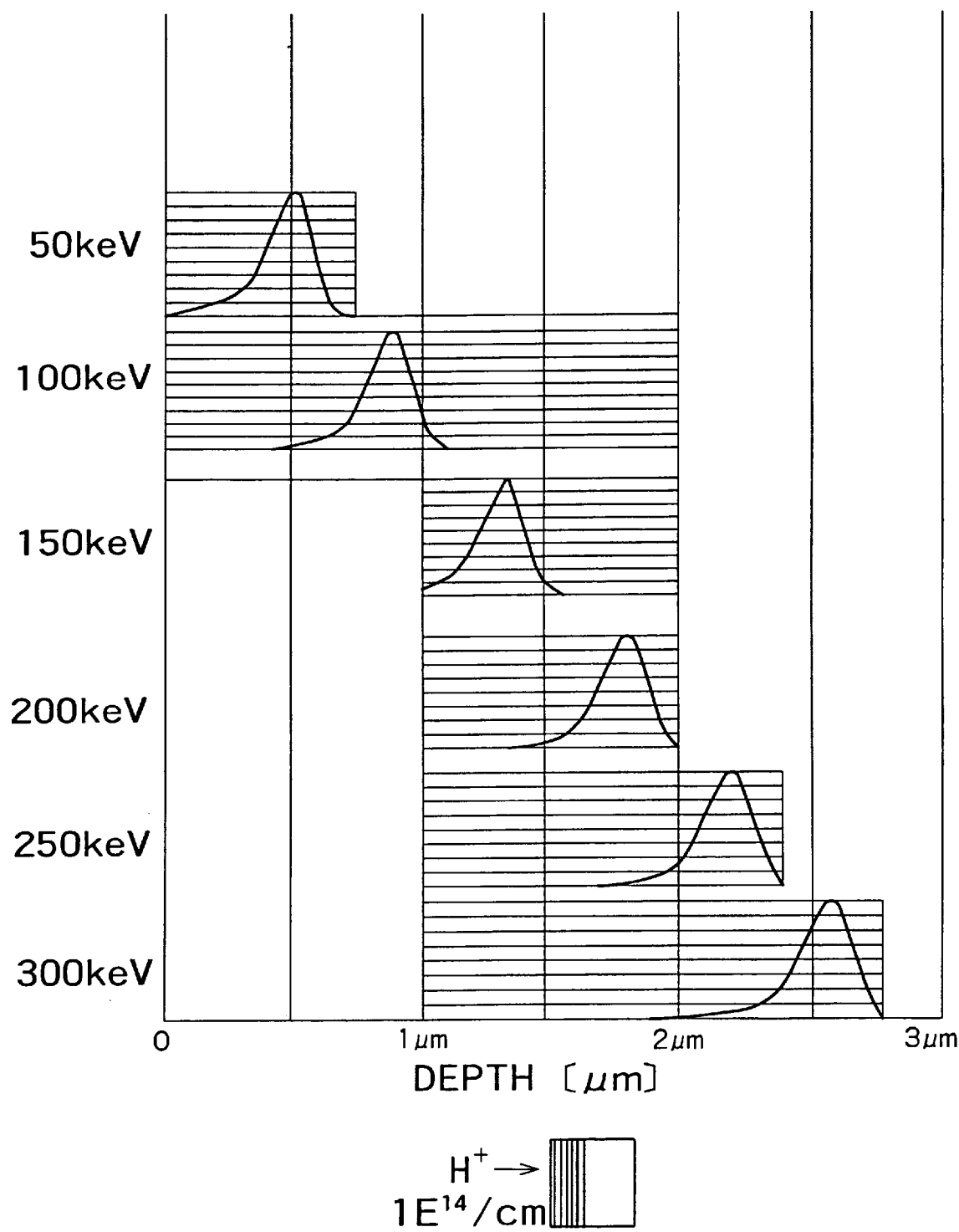
FIG. 21 is a graph showing the relationships between the acceleration voltage of the hydrogen implantation and the depth of the hydrogen-implanted region.

FIG. 21 is a graph showing the relationship between the acceleration voltage of the hydrogen implantation and the depth of the hydrogen-implanted region.

The dose can be fixed at about $1 \times 10^{14-15}/cm^2$ for the hydrogen implantation. The acceleration voltage is controlled in the range of 20–300 KeV so that the hydrogen-implanted regions are respectively formed in the each layers 110a and 110b in the each interconnect layers 108, 115 and 116. By controlling the implantation condition in this way, hydrogen would not reach the substrate 100.

The substrate 100 is mounted on the xyz θ-adjustable stage 120 and moved in a parallel direction to the surface of the mask 119. The alignment and the gap spacing between the mask 119 and the substrate 100 are adjusted and hydrogen 118 is precisely implanted into the predetermined position. The pattern of the opening can be utilized as the marker for the alignment. The positions of the mask 119 and the substrate 100 are detected by using a laser beam. Thus, the mask 119 and the substrate 100 are aligned and substrate 100 is moved to the predetermined position.

The gap spacing between the mask 119 and the substrate 100 can be also controlled by the stage 120 and may be set at 50 $\mu$m.

By the above-explained procedure, the hydrogen-implanted regions are respectively formed in the each layers 110a and 110b which function as the temporary layers for the each interconnect layers 108, 115 and 116.

Then, the wafer is annealed at 200° C. for 15 minutes in a nitrogen or ammonia gas atmosphere in order to recover the implantation-induced damage.

Figure 20G:
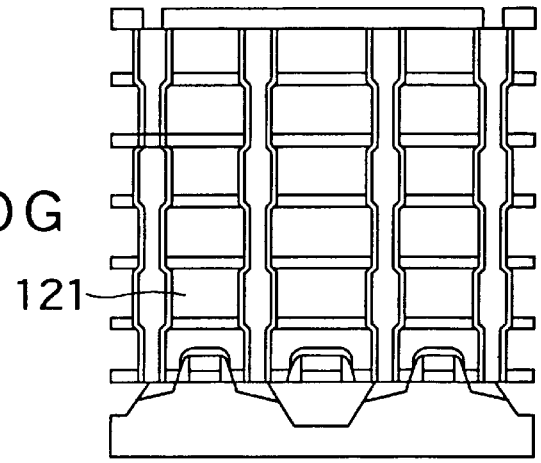

Next as shown in FIG. 20G, the SiON layers 110a and 110b are removed by an oxygen plasma irradiation. Thus, the air-gap interconnect structure is formed where each interconnect layers are separated by the layers 109a and 109b.

This example also utilizes the phenomena that the etching rate of layers containing nitrogen with an oxygen plasma is remarkably increased by implanting hydrogen into these layers. According to the invention, the nitrogen-containing layers between the barrier metal film 113 and the copper alloy film 114 can be etched away and the air-gaps are formed therebetween. As a result, each interconnect layers are separated by the air-gap layer 121. Since the dielectric constant of air is 1, parasitic capacitance between each interconnect layers can be effectively reduced.

Conventionally, the process of such multilevel air-gap interconnections was fabricated by ashing process, which was required for each interconnect layer to remove temporary layer made by carbon. In contrast to this, according to the invention, the multilevel air-gap interconnections structure can be formed at the same process by simply irradiating the oxygen plasma. The process can be further simplified by utilizing appropriate masks for the implantation process of the hydrogen.

While the above-explained example include three-layered interconnections, the invention is not limited to the specific case. It is apparent that the invention can be applied to the structures which have only two-layered interconnections or more than four-layered interconnections.

One of the features of the above-explained example is that the depths of the hydrogen implanted region are controlled by the implantation condition such as acceleration voltage and the dose amount. According to the invention, it is also easy to selectively form the air-gap only in a specific interconnect layer within the multi-layered interconnect structure by simply adjusting the implantation condition of hydrogen.

In the above-explained example, the lower and upper SiON layers 110a and 110b are employed as the temporary layer which can be etched away by exposing to the excited oxygen atmosphere, and the $SiO_2$ layers 109a and 109b are employed as the permanent layers which is not etched away. However, the invention is not limited to this specific example. Any other nitrogen-containing layers which can be selectively etched over the $SiO_2$ layers 109a and 109b may be employed as the temporary layers as well.

One alternative may be SiOF layer doped with nitrogen. By using this layer, barrier metal film 113 can be unused since SiOF doped with nitrogen prevent the diffusion of copper therein. Besides, this material realizes even higher etching rate when exposed to the oxygen plasma because nitrogen and fluorine are contained in the material.

As for the layers 109a and 109b, any other material which is not etched by the oxygen plasma, can be employed.

The lower $SiO_2$ layer 109a may not be used. If the layer 109a is unused, the lower temporary layer and its neighboring upper temporary layer can be formed in a single temporary layer, and wiring grooves and contact holes can be formed in this single temporary layer.

Embodiments of the invention have been explained heretofore by way of specific examples. However, the invention is not limited to those specific examples. For example, although such examples have been explained mainly about fabrication of photomasks, the invention is of course applicable to semiconductor interconnect techniques and mask or pattern transfer techniques using X-rays or electron beams as exposure sources without being limited to photolithography.

Furthermore, also for various kinds of elements having compound layers, such as semiconductor devices and optical elements or micro machines, image display devices, and so on, the invention is similarly applicable and ensures the same effects.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No. 2000-095143 filed on Mar. 30, 2000 and No. 2000-300633 filed on Sep. 29, 2000 including specifications, claims, drawings and summaries are incorporated herein by reference in its entirety.

What is claimed is:

1. A nitride pattern, comprising a nitride layer having a selectively removed portion, the portion being implanted with hydrogen and then exposed to an atmosphere containing excited oxygen so as to be selectively removed the portion from the nitride layer.

2. The nitride pattern according to claim 1, wherein the portion is implanted with the hydrogen and also with fluorine.

3. The nitride pattern according to claim 1, wherein the nitride layer contains at least one element selected from the group consisting of chromium (Cr), titanium (Ti), aluminum (Al), molybdenum (Mo), tungsten (W), gallium (Ga), indium (In) and boron (B).

4. A semiconductor device comprising:

a substrate;

a semiconductor element formed on the substrate;

a nitride layer formed over the semiconductor element, the nitride layer having a selectively removed region, the region being implanted by hydrogen and then exposed to an atmosphere containing excited oxygen so as to be selectively removed the region from the nitride layer.

5. The semiconductor device according to claim 4, wherein the nitride layer consist of a nitride semiconductor.

6. The semiconductor device according to claim 4, further comprising a interconnect layer and an other nitride layer formed on the interconnect layer, the other nitride layer having an other selectively removed region, the other region being implanted by hydrogen and then exposed to an atmosphere containing excited oxygen so as to be selectively removed the other region.

7. The semiconductor device according to claim 6, wherein both the region and the other region are formed by first implanting hydrogen at almost same time and then by exposing to excited oxygen at almost same time.

8. A semiconductor device comprising:

a substrate;

a plurality of transistor elements formed on the substrate;

an interconnect layer formed over the transistor elements;

a first nitride layer below the interconnect layer having a first air portions;

a second nitride layer on the interconnect layer having a second air portions; and a protective layer over the second nitride layer.

* * * * *